United States Patent
Xue et al.

(10) Patent No.: US 10,818,259 B2
(45) Date of Patent: Oct. 27, 2020

(54) SCANNING TRIGGER UNIT, GATE DRIVING CIRCUIT AND METHOD FOR DRIVING THE SAME AND DISPLAY APPARATUS

(71) Applicants: BOE Technology Group Co., Ltd., Beijing (CN); HEFEI BOE OPTOELECTRONICS TECHNOLOGY CO., LTD., Anhui (CN)

(72) Inventors: Wei Xue, Beijing (CN); Silin Feng, Beijing (CN); Zhifu Dong, Beijing (CN); Hongmin Li, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 121 days.

(21) Appl. No.: 16/129,523

(22) Filed: Sep. 12, 2018

(65) Prior Publication Data
US 2019/0096352 A1    Mar. 28, 2019

(30) Foreign Application Priority Data

Sep. 22, 2017  (CN) .......................... 2017 1 0870115

(51) Int. Cl.
*G11C 19/00*    (2006.01)
*G09G 3/36*    (2006.01)
*G11C 19/28*    (2006.01)

(52) U.S. Cl.
CPC .......... *G09G 3/3677* (2013.01); *G11C 19/28* (2013.01); *G09G 2310/0286* (2013.01);
(Continued)

(58) Field of Classification Search
None
See application file for complete search history.

(56) References Cited

U.S. PATENT DOCUMENTS 6,052,426 A * 4/2000 Maurice ............... G09G 3/3677
377/78
6,064,713 A * 5/2000 Lebrun ................ G09G 3/3677
377/67
(Continued)

FOREIGN PATENT DOCUMENTS

CN    1901017 A    1/2007
CN    102428521 A    4/2012
(Continued)

OTHER PUBLICATIONS

Office Action issued in corresponding Chinese Patent Application No. 201710870115.X, dated Oct. 12, 2019.

*Primary Examiner* — Tuan T Lam
(74) *Attorney, Agent, or Firm* — McDermott Will & Emery LLP

(57) ABSTRACT

According to one aspect of this disclosure, a scanning trigger unit includes a clock signal terminal, a first signal input terminal, a fixed level signal terminal, a first input sub-circuit, an output sub-circuit, a first holding sub-circuit, and a signal output terminal. The first input sub-circuit is connected to the first signal input terminal and a control node, and is configured to provide a first valid signal to the control node; the output sub-circuit is connected to the fixed level signal terminal, the clock signal terminal, and the control node, and is configured to provide a second valid signal to the signal output terminal; and the first holding sub-circuit is connected to the fixed level signal terminal and the signal output terminal, and is configured to hold the second valid signal at the signal output terminal for a predetermined time.

16 Claims, 17 Drawing Sheets

(52) U.S. Cl.
CPC ..... *G09G 2310/06* (2013.01); *G09G 2310/08* (2013.01); *G11C 19/287* (2013.01)

(56) References Cited

U.S. PATENT DOCUMENTS

| | | | |
|---|---|---|---|
| 6,919,874 B1* | 7/2005 | Maurice | G09G 3/3677 |
| | | | 345/100 |
| 2006/0146978 A1* | 7/2006 | Jang | G09G 3/3677 |
| | | | 377/64 |
| 2007/0018918 A1 | 1/2007 | Chung | |
| 2007/0086558 A1* | 4/2007 | Wei | G11C 19/28 |
| | | | 377/64 |
| 2007/0247932 A1* | 10/2007 | Tobita | G09G 3/3677 |
| | | | 365/189.12 |
| 2007/0274433 A1* | 11/2007 | Tobita | G09G 3/3677 |
| | | | 377/64 |
| 2009/0128476 A1* | 5/2009 | Lee | G09G 3/3677 |
| | | | 345/98 |
| 2010/0039363 A1* | 2/2010 | Lee | G09G 3/3266 |
| | | | 345/100 |
| 2010/0060561 A1* | 3/2010 | Deane | G09G 3/3677 |
| | | | 345/100 |
| 2010/0156862 A1* | 6/2010 | Kim | G09G 3/3677 |
| | | | 345/206 |
| 2011/0007040 A1 | 1/2011 | John et al. | |
| 2012/0032615 A1 | 2/2012 | Kikuchi et al. | |
| 2012/0256817 A1 | 10/2012 | Chen et al. | |
| 2013/0028370 A1 | 1/2013 | Kikuchi et al. | |
| 2013/0135284 A1* | 5/2013 | Tseng | G11C 19/28 |
| | | | 345/212 |
| 2016/0321999 A1* | 11/2016 | Yang | G09G 3/3266 |
| 2017/0011699 A1* | 1/2017 | Wang | G11C 19/28 |
| 2018/0047327 A1 | 2/2018 | Wang | |

FOREIGN PATENT DOCUMENTS

| | | |
|---|---|---|
| CN | 102834871 A | 12/2012 |
| CN | 104269145 A | 1/2015 |
| CN | 105469738 A | 4/2016 |
| CN | 105702196 A | 6/2016 |
| JP | 2011510423 A | 3/2011 |
| JP | 2012221551 A | 11/2012 |

* cited by examiner

SCANNING TRIGGER UNIT, GATE DRIVING CIRCUIT AND METHOD FOR DRIVING THE SAME AND DISPLAY APPARATUS

CROSS-REFERENCE TO RELATED APPLICATION(S)

This application claims priority to the Chinese Patent Application No. 201710870115.X, filed on Sep. 22, 2017, which is incorporated herein by reference in its entirety.

TECHNICAL FIELD

The present disclosure relates to the field of display, and more particularly, to a scanning trigger unit, a gate driving circuit and a method for driving the same, and a display apparatus.

BACKGROUND

In a Thin Film Transistor (TFT)-based Liquid Crystal Display (LCD), a gate driving circuit for driving a gate may be formed on a display panel to form a Gate drive On Array (GOA). In a gate driving circuit in the related art, multiple stages of cascaded shift registers are provided, and an input signal for a first stage of shift register and a reset signal for a last stage of shift register are provided through separate Vertical Starting (STV) signal lines.

However, the presence of the separate STV signal lines increases a layout area of the gate driving circuit, which is disadvantageous for achieving a narrow bezel of the display panel.

SUMMARY

Embodiments of the present disclosure provide a scanning trigger unit, a gate driving circuit and a method for driving the same, and a display apparatus.

According to an aspect of the embodiments of the present disclosure, there is provided a scanning trigger unit, comprising a clock signal terminal, a first signal input terminal, a fixed level signal terminal, a first input sub-circuit, an output sub-circuit, a first holding sub-circuit, and a signal output terminal, wherein the first input sub-circuit is connected to the first signal input terminal and a control node respectively, and is configured to provide a first valid signal to the control node according to a signal at the first signal input terminal; the output sub-circuit is connected to the fixed level signal terminal, the clock signal terminal, and the control node, and is configured to provide a second valid signal to the signal output terminal according to a signal at the control node and a signal at the clock signal terminal; and the first holding sub-circuit is connected to the fixed level signal terminal and the signal output terminal, and is configured to hold the second valid signal at the signal output terminal for a predetermined time.

In an example, the output sub-circuit comprises a first transistor and a second transistor, wherein the first transistor has a first terminal and a control terminal connected to the clock signal terminal, and a second terminal connected to the signal output terminal, and the second transistor has a control terminal connected to the control node, a first terminal connected to the fixed level signal terminal, and a second terminal connected to the signal output terminal.

In an example, a ratio of a channel aspect ratio of the first transistor relative to a channel aspect ratio of the second transistor is in a range from 1:6 to 1:3.

In an example, the first holding sub-circuit comprises a first capacitor having a first terminal connected to the fixed level signal terminal, and a second terminal connected to the signal output terminal.

In an example, the first capacitor is configured so that the predetermined time is one clock cycle of a clock signal input to the clock signal terminal.

In an example, the first input sub-circuit comprises: a third transistor having a control terminal and a first terminal connected to the first signal input terminal, and a second terminal connected to the control node.

In an example, the scanning trigger unit further comprises a second signal input terminal and a second input sub-circuit, wherein the second input sub-circuit is connected to the second signal input terminal and the control node respectively, and is configured to provide a third valid signal to the control node according to a signal at the second signal input terminal.

In an example, the second input sub-circuit comprises: a fourth transistor having a control terminal and a first terminal connected to the second signal input terminal, and a second terminal connected to the control node.

In an example, the scanning trigger unit further comprises a second holding sub-circuit, wherein the second holding sub-circuit is connected to the fixed level signal terminal and the control node respectively, and is configured to hold a potential at the control node.

In an example, the second holding sub-circuit comprises a second capacitor having a first terminal connected to the fixed level signal terminal, and a second terminal connected to the control node.

According to another aspect of the present disclosure, there is provided a scanning trigger unit, comprising a clock signal terminal, a first signal input terminal, a second signal input terminal, a fixed level signal terminal, a signal output terminal, a first transistor, a second transistor, a third transistor, a fourth transistor and a first capacitor, wherein the first transistor has a first terminal and a control terminal connected to the clock signal terminal, and a second terminal connected to the signal output terminal; the second transistor has a control terminal connected to a control node, a first terminal connected to the fixed level signal terminal, and a second terminal connected to the signal output terminal; the third transistor has a control terminal and a first terminal connected to the first signal input terminal, and a second terminal connected to the control node; the fourth transistor has a control terminal and a first terminal connected to the second signal input terminal, and a second terminal connected to the control node; and the first capacitor has a first terminal connected to the fixed level signal terminal, and a second terminal connected to the signal output terminal.

According to another aspect of the present disclosure, there is provided a gate driving circuit, comprising: a first scanning trigger unit which is the scanning trigger unit according to one embodiment of the present disclosure; N stages of shift registers having an STV signal terminal connected to a signal output terminal of the first scanning trigger unit, where N is an integer greater than or equal to 2; a first signal line connected to a first signal input terminal of the first scanning trigger unit; and a first clock signal line connected to a clock signal terminal of the first scanning trigger unit.

In an example, the gate driving circuit further comprises: a second clock signal line; and a second scanning trigger unit which is the scanning trigger unit according to the present disclosure, having a signal output terminal connected to a reset terminal of an $N^{th}$ stage of shift register, a first signal input terminal connected to the first signal line, and a clock signal terminal connected to the second clock signal line, wherein a clock signal on the first clock signal line is an inverted signal of a clock signal on the second clock signal line.

According to another aspect of the present disclosure, there is provided a gate driving circuit, comprising: a first scanning trigger unit which is the scanning trigger unit according to one embodiment of the present disclosure; a second scanning trigger unit which is the scanning trigger unit according to one embodiment of the present disclosure; N stages of shift registers, wherein a signal output terminal of the first scanning trigger unit is connected to an STV signal terminal of the N stages of shift registers, and a signal output terminal of the second scanning trigger unit is connected to a reset terminal of an $N^{th}$ stage of shift register, where N is an integer greater than or equal to 2; a first signal line and a second signal line, wherein the first scanning trigger unit has a first signal input terminal connected to the first signal line, and a second signal input terminal connected to the second signal line, and the second scanning trigger unit has a first signal input terminal connected to the first signal line, and a second signal input terminal connected to the second signal line; and a first clock signal line and a second clock signal line, wherein a clock signal on the first clock signal line is an inverted signal of a clock signal on the second clock signal line, a clock signal terminal of the first scanning trigger unit is connected to the first clock signal line, and a clock signal terminal of the second scanning trigger unit is connected to the second clock signal line.

According to another aspect of the present disclosure, there is provided a display apparatus, comprising the gate driving circuit according to the present disclosure.

According to another aspect of the present disclosure, there is provided a method for driving the scanning trigger unit according to the present disclosure, comprising: in a first time period in which an input signal at the first signal input terminal is at a first level, and a signal at the clock signal terminal is at a second level, outputting, by the signal output terminal of the scanning trigger unit, a second level, and charging the first holding sub-circuit; in a second time period in which the input signal at the first signal input terminal is at a second level, charging, by the input sub-circuit, the control node in response to the input signal, so that level coupling of the output terminal is reduced; and in a third time period in which the input signal at the first signal input terminal is at the second level, discharging the first holding sub-circuit through the output sub-circuit, and outputting, by the signal output terminal of the scanning trigger unit, a first level.

According to another aspect of the present disclosure, there is provided a method for driving the gate driving circuit according to the present disclosure, comprising: in a triggering time period, providing a signal having a first level through the first signal line, and providing a clock signal having a second level through the first clock signal line; in a holding time period, providing a signal having a second level through the first signal line, and providing a clock signal having a first level through the first clock signal line; in a driving time period, providing a signal having the second level through the first signal line, and providing a signal having the first level and a signal having the second level periodically through the first clock signal line; and in a resetting time period, providing a signal having the first level through the first signal line, and providing a clock signal having the first level through the first clock signal line.

According to another aspect of the present disclosure, there is provided a method for driving the gate driving circuit according to the present disclosure, comprising: in a triggering time period, providing a signal having a first level through the first signal line, providing a clock signal having a second level through the first clock signal line, and providing a clock signal having a first level through the second clock signal line; in a holding time period, providing a signal having a second level through the first signal line, providing a clock signal having a first level through the first clock signal line, and providing a clock signal having a second level through the second clock signal line; in a driving time period, providing a signal having the second level through the first signal line, and providing a signal having the first level and a signal having the second level periodically through the first clock signal line and the second clock signal line; and in a resetting time period, providing a signal having the first level through the first signal line, providing a clock signal having the first level through the first clock signal line, and providing a clock signal having the second level through the second clock signal line.

According to another aspect of the present disclosure, there is provided a method for driving the gate driving circuit according to the present disclosure, comprising: in a triggering time period, providing a signal having a first level through the first signal line and the second signal line, providing a clock signal having a second level through the first clock signal line, and providing a clock signal having a first level through the second clock signal line; in a holding time period, providing a signal having a second level through one of the first signal line or the second signal line which is connected to the input sub-circuit of the first stage of shift register, providing a signal having a first level through the other one of the first signal line or the second signal line, providing a clock signal having a first level through the first clock signal line, and providing a clock signal having a second level through the second clock signal line; in a driving time period, holding levels on the first signal line and the second signal line to be the same as those in the holding time period; and in a resetting time period, providing a signal having the first level through the first signal line and the second signal line, providing a clock signal having the first level through the first clock signal line, and providing a clock signal having the second level through the second clock signal line.

According to another aspect of the present disclosure, there is provided a method for driving the gate driving circuit according to the present disclosure, comprising: in a triggering time period, providing a signal having a first level through the first signal line and the second signal line, providing a clock signal having a first level through the first clock signal line, and providing a clock signal having a second level through the second clock signal line; in a holding time period, providing a signal having a second level through one of the first signal line or the second signal line which is connected to the reset sub-circuit of the last stage of shift register, providing a signal having a first level through the other one of the first signal line or the second signal line, providing a clock signal having a second level through the first clock signal line, and providing a clock signal having a first level through the second clock signal line; in a driving time period, holding levels on the first signal line and the second signal line to be the same as those in the holding time period; and in a resetting time period, providing a signal having the first level through the first signal line and the second signal line, providing a clock signal having the second level through the first clock signal line, and providing a clock signal having the first level through the second clock signal line.

DETAILED DESCRIPTION

Figure 1:
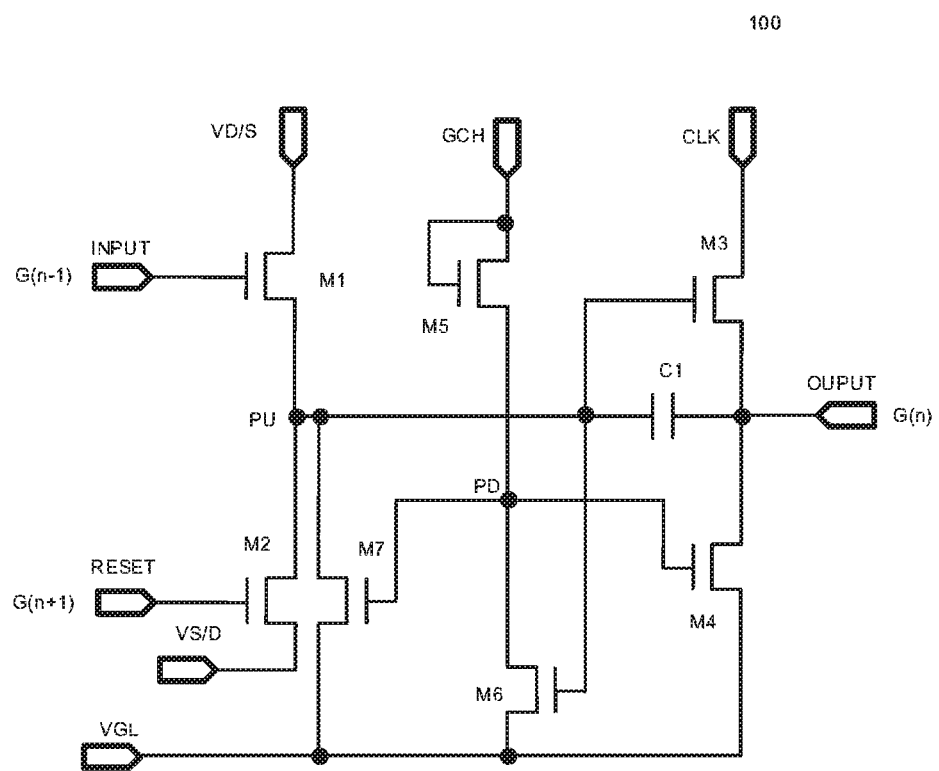
FIG. 1 illustrates a schematic circuit diagram of a shift register.

In order to make the purposes, technical solutions and advantages of the embodiments of the present disclosure more clear, the technical solutions in the embodiments of the present disclosure will be clearly and completely described below in conjunction with the accompanying drawings in the embodiments of the present disclosure. It is apparent that the described embodiments are a part of the embodiments of the present disclosure, instead of all the embodiments. All other embodiments obtained by those of ordinary skill in the art based on the described embodiments of the present disclosure without any creative work are within the protection scope of the present disclosure. It should be illustrated that throughout the accompanying drawings, the same elements are represented by the same or similar reference signs. In the following description, some specific embodiments are for illustrative purposes only, and are not to be construed as limiting the present disclosure, but only examples of the embodiments of the present disclosure. Conventional structures or configurations will be omitted when they may cause confusion to the understanding of the present disclosure. It should be illustrated that shapes and sizes of various components in the accompanying drawings do not reflect true sizes and proportions, but merely illustrate contents of the embodiments of the present disclosure.

Technical or scientific terms used in the embodiments of the present disclosure should be of ordinary meaning as understood by those skilled in the art, unless otherwise defined. The terms "first", "second" and similar words used in the embodiments of the present disclosure do not denote any order, quantity, or importance, but are merely used to distinguish different components from each other.

Furthermore, in the description of the embodiments of the present disclosure, the term "connected with" or "connected to" may mean that two components are directly connected, or that two components are connected via one or more other components. In addition, the two components may be connected or coupled by wire or wirelessly.

Further, in the description of the embodiments of the present disclosure, the terms "first level" and "second level" are only used to distinguish magnitudes of the two levels from each other. For example, the following description will be made by taking the "first level" being a low level and the "second level" being a high level as an example. It can be understood by those skilled in the art that the present disclosure is not limited thereto.

Transistors used in the embodiments of the present disclosure may all be thin film transistors or field effect transistors or other devices having the same characteristics. In some embodiments, the thin film transistors used in the embodiments of the present disclosure may be oxide semiconductor transistors. As a source and a drain of a thin film transistor used here are symmetrical, the source and the drain thereof are interchangeable. In the embodiments of the present disclosure, a gate is referred to as a control terminal, one of the source and the drain is referred to as a first terminal, and the other of the source and the drain is referred to as a second terminal.

Figure 2A:
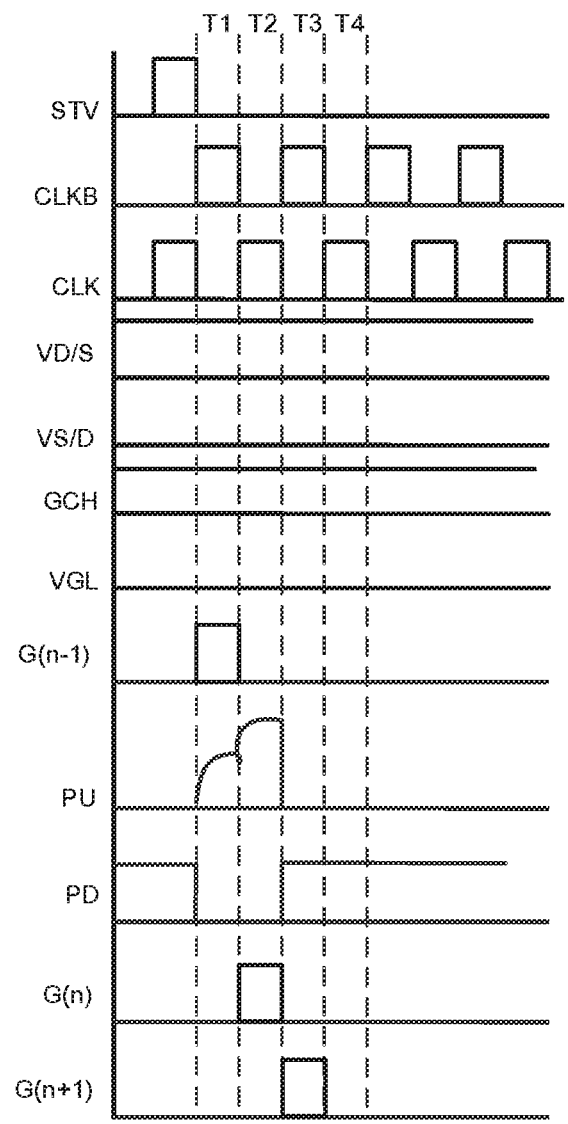
FIG. 2A illustrates a schematic timing diagram of an operation of the shift register in FIG. 1.
Figure 2B:
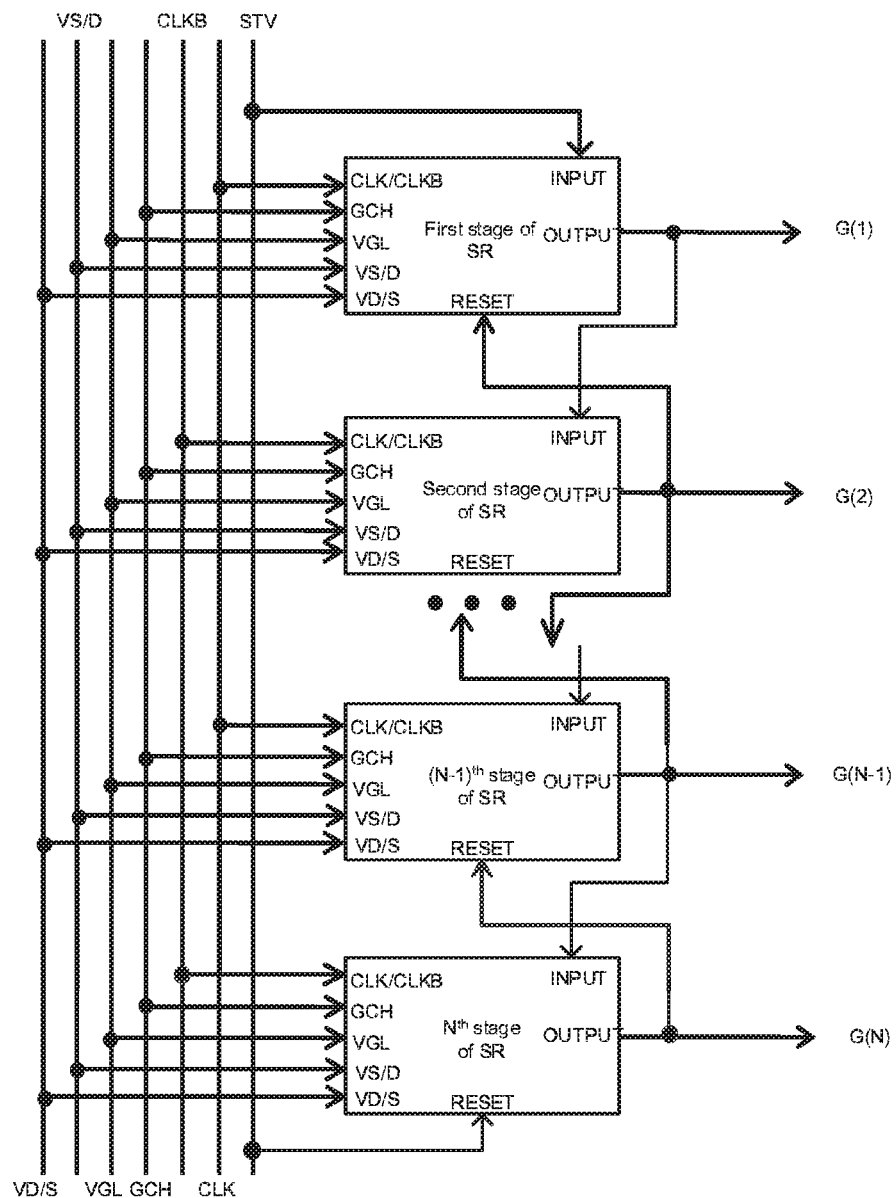
FIG. 2B illustrates a schematic diagram of a gate driving circuit comprising a plurality of cascaded shift registers, wherein each of the shift registers is the shift register in FIG. 1.

FIG. 1 illustrates a schematic circuit diagram of a shift register 100. The shift register in FIG. 1 may realize bidirectional scanning, wherein compared with forward scanning, when backward scanning is realized, it only needs to interchange a timing of a clock signal CLK with a timing of a clock signal CLKB and interchange a timing of a power supply voltage signal VD/S with a timing of a power supply voltage signal VS/D. FIG. 2A illustrates a schematic timing diagram of an operation of the shift register in FIG. 1, and FIG. 2B illustrates a schematic diagram of a gate driving circuit comprising a plurality of cascaded shift registers, wherein each of the shift registers is the shift register in FIG. 1. Next, with reference to FIGS. 1, 2A and 2B, the operation of the shift register 100 will be briefly described by taking forward scanning as an example. It should be illustrated that the description is made below by taking the shift register 100 being an $n^{th}$ stage of shift register SR in the N stages of cascaded shift registers as an example, where N is an integer greater than or equal to 2, and n is an integer greater than 2 and less than N. It can be understood by those skilled in the art that terms "an $n^{th}$ stage", "an $(n-1)^{th}$ stage" and "an $(n+1)^{th}$ stage", as used herein, only represent that the $n^{th}$ stage is adjacent to the $(n-1)^{th}$ stage and the $(n+1)^{th}$ stage. Although a case in which each stage comprises a single shift register is illustrated in FIG. 2B, this is merely exemplary, and in other embodiments, each stage may comprise a plurality of shift register units.

As shown in FIG. 2B, the $n^{th}$ stage of shift register SR has an INPUT terminal connected to an OUTPUT terminal of an $(n-1)^{th}$ stage of SR, and a RESET terminal connected to an OUTPUT terminal of an $(n+1)^{th}$ stage of SR. Specifically, an INPUT terminal of a first stage of SR and a RESET terminal of an $N^{th}$ stage of SR are connected to an STV signal line to receive an STV signal. A clock signal terminal of the $n^{th}$ stage of SR may be connected to a CLK signal or a CLKB signal. The following example is described by taking the clock signal terminal of the $n^{th}$ stage of SR being connected to the CLK signal as an example.

In a first time period T1 in FIG. 2A, the input signal terminal INPUT of the $n^{th}$ stage of shift register 100 in FIG. 1 receives a high level signal G(n−1) output at the OUTPUT terminal of the $(n-1)^{th}$ stage, so that a transistor M1 is turned on; and a clock signal input terminal CLK of the $n^{th}$ stage of shift register 100 is at a low potential, and a VD/S signal at a high potential charges a capacitor C to pull up a potential at a pull-up node PU. In this case, as GCH is at a high level, a transistor M5 and a transistor M6 are turned on. A ratio of a channel aspect ratio of M5 relative to a channel aspect ratio of M6 is designed, so that a potential at a node PD is at a low potential in this case, to cause a transistor M4 and a transistor M7 to be turned off, thereby ensuring that an output terminal OUTPUT stably outputs a low level.

In a second time period T2, G(n−1) received at the INPUT terminal becomes a low level, and the transistor M1 is turned off. In this case, the pull-up node PU continues to be maintained at a high potential, and a transistor M3 is maintained in a turn-on state. In this case, the clock signal input terminal CLK is at a high potential. Due to the action of bootstrapping, the voltage at the pull-up node PU is amplified, and the transistor M3 is turned on, thereby outputting a driving signal G(n) at a high level to the output terminal OUTPUT. In this case, the pull-up node PU is at a high potential, and the transistor M6 is still in a turn-on state, so that the transistor M4 and the transistor M7 continue to be turned off to ensure a stable output of the signal.

In a third time period T3, a reset signal input terminal RESET receives an output signal G(n+1) at a high level of the $(n+1)^{th}$ stage. A high level signal at the reset signal input terminal RESET causes a transistor M2 to be turned on, so as to pull down the pull-up node PU to a low potential VS/D, thereby turning off the transistor M3 so that it no longer outputs a clock signal CLK. At the same time, as the potential at the pull-up node PU is pulled down, the transistor M6 is in a turn-off state, and the PD point is no longer discharged. As GCH is at a high level, the transistor M5 is turned off, so as to pull down the level at the output terminal OUTPUT to VGL.

In a fourth time period T4, as GCH is at a high potential, the transistor M5 is turned on. In this case, the potential at the node PD is pulled up, to cause the transistor M4 and the transistor M7 to be turned on, and further discharge (de-noise) the pull-up node PU and the output terminal OUTPUT, so that a coupling noise voltage generated by the clock signal CLK is eliminated, thereby ensuring a stable low-voltage output at the output terminal OUTPUT.

Before the arrival of a next frame, the shift register 100 is always in the fourth time period T4, and the circuit is continuously de-noised to further ensure a stable output of the signal.

As there is no G(n−1) signal input at the INPUT terminal of the first stage of SR, and there is not G(n+1) signal input at the RESET terminal of the $N^{th}$ stage (last stage) of SR, when the gate driving circuit is designed, a trigger signal STV is input to the first stage of SR and is further used to reset the last stage of SR. The STV signal is usually supplied by providing separate STV signal lines, which increases the layout area of the gate driving circuit, and is disadvantageous for achieving a narrow bezel of the TFT-LCD display panel.

One aspect of the present disclosure provides a scanning trigger unit, through which an STV signal and a reset signal are generated, thereby eliminating the need to provide separate STV signal lines, and thus saving the layout area of the gate driving circuit.

Figure 3A:
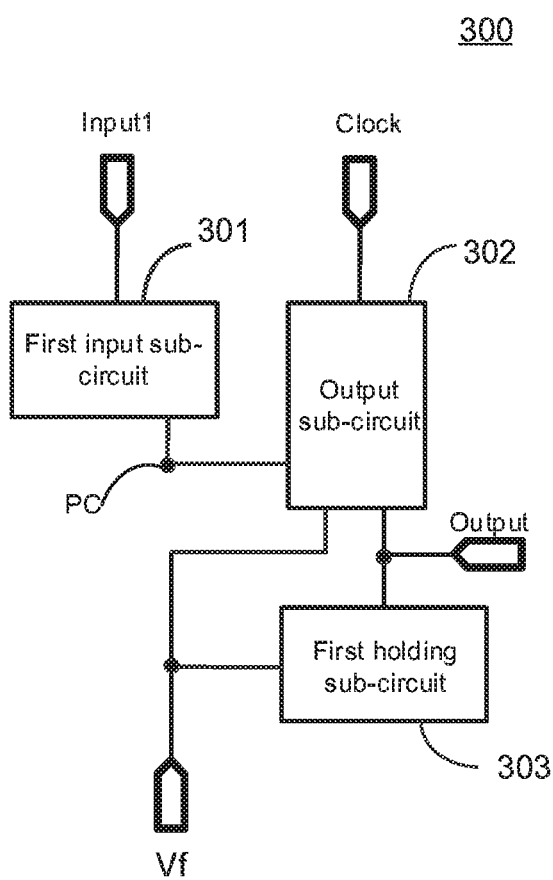
FIGS. 3A, 3B, and 3C illustrate schematic block diagrams of scanning trigger units according to an embodiment of the present disclosure respectively.

FIG. 3A illustrates a schematic block diagram of a scanning trigger unit according to an embodiment of the present disclosure. As shown in FIG. 3A, the scanning trigger unit 300 may comprise a clock signal terminal Clock, a first signal input terminal Input1, a fixed level signal terminal Vf, a first input sub-circuit 301, an output sub-circuit 302, a first holding sub-circuit 303, and a signal output terminal Output. As shown in FIG. 3, the first input sub-circuit 301 is connected to the first signal input terminal Input1 and a control node PC respectively, and the first input sub-circuit 301 is configured to provide a first valid signal to the control node PC according to a signal at the first signal input terminal Input1. The output sub-circuit 302 is connected to the fixed level signal terminal Vf, the clock signal terminal and the control node PC, and the output sub-circuit 302 is configured to provide a second valid signal to the signal output terminal Output according to a signal at the control node PC and a signal at the clock signal terminal Clock. The first holding sub-circuit 303 is connected to the fixed level signal terminal Vf and the signal output terminal Output, and the first holding sub-circuit 303 is configured to hold the second valid signal at the signal output terminal Output for a predetermined time.

Figure 3B:
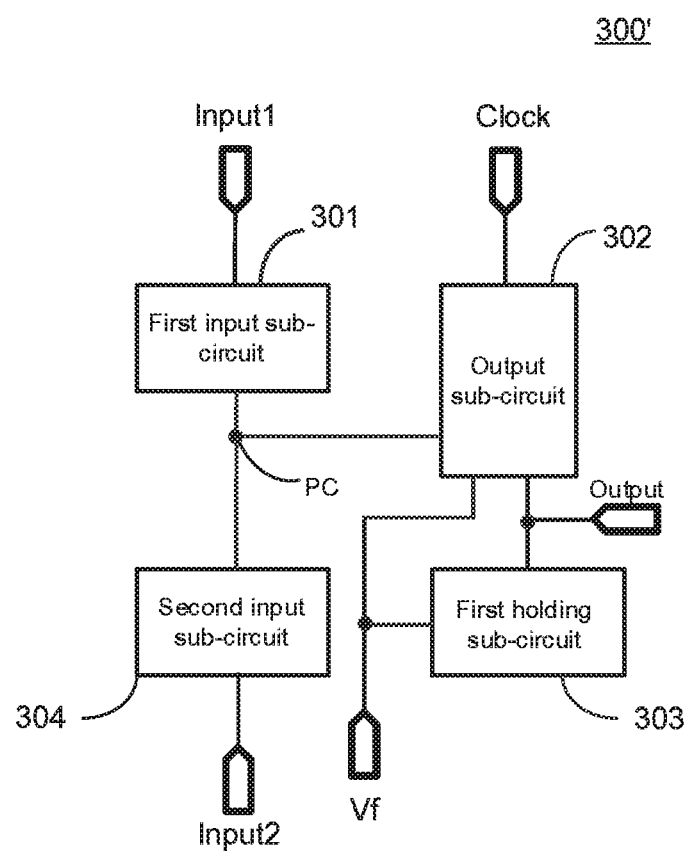

FIG. 3B illustrates a schematic block diagram of a scanning trigger unit according to another embodiment of the present disclosure. As shown in FIG. 3B, the scanning trigger unit 300' may further comprise a second signal input terminal Input2 and a second input sub-circuit 304. The second input sub-circuit 304 is connected to the second signal input terminal Input2 and the control node PC respectively, and the second input sub-circuit 304 is configured to provide a third valid signal to the control node PC according to a signal at the second signal input terminal Input2.

Figure 3C:
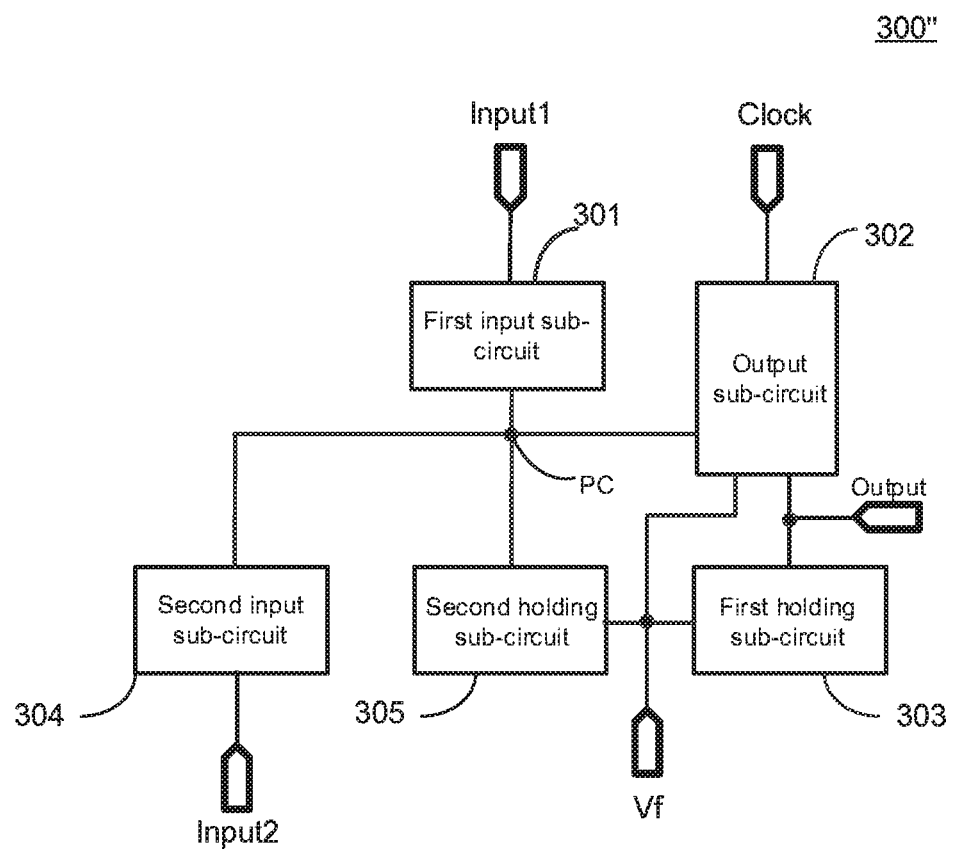

FIG. 3C illustrates a schematic block diagram of a scanning trigger unit according to yet another embodiment of the present disclosure. As shown in FIG. 3C, the scanning trigger unit 300" may further comprise a second holding sub-circuit 305. The second holding sub-circuit 305 is connected to the fixed level signal terminal Vf and the control node PC respectively, and is configured to hold the potential at the control node PC.

Figure 4A:
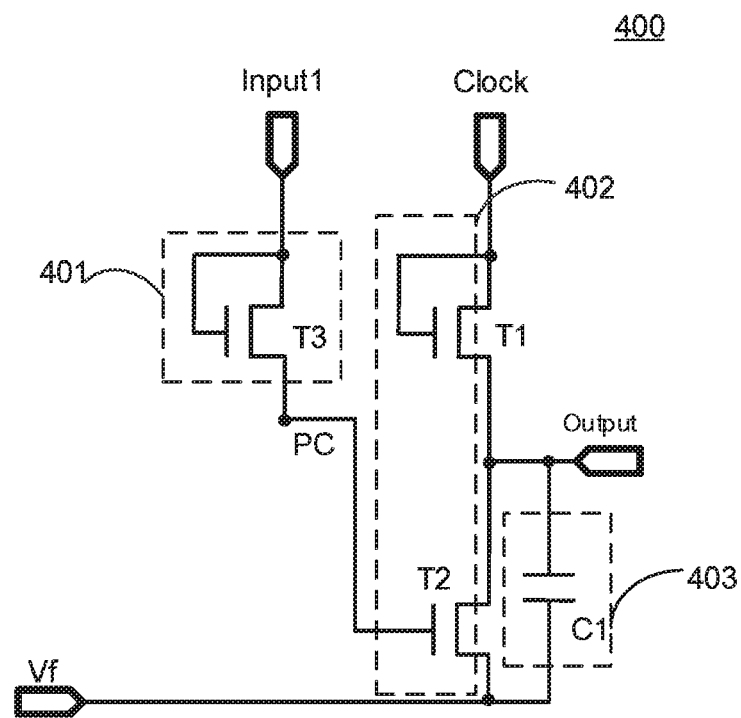
FIGS. 4A, 4B, and 4C illustrate schematic circuit diagrams of the scanning trigger units corresponding to FIGS. 3A, 3B, and 3C respectively.

FIG. 4A illustrates a schematic circuit diagram of the scanning trigger unit in FIG. 3A. As shown in FIG. 4A, the scanning trigger unit 400 according to an example of the present disclosure may comprise a clock signal terminal Clock, a first signal input terminal Input1, a fixed level signal terminal Vf, a first input sub-circuit 401, an output sub-circuit 402, a first holding sub-circuit 403 and a signal output terminal Output. The output sub-circuit 402 may comprise a first transistor T1 and a second transistor T2. The first transistor T1 has a first terminal and a control terminal connected to the clock signal terminal Clock, and a second terminal connected to the signal output terminal Output. The second transistor T2 has a control terminal connected to the control node PC, a first terminal connected to the fixed level signal terminal Vf, for example, VGL, and a second terminal connected to the signal output terminal Output. The first input sub-circuit 401 may comprise a third transistor T3 having a control terminal and a first terminal connected to the first signal input terminal Input1, and a second terminal connected to the control node PC. The first holding sub-circuit 403 comprises a first capacitor C1 having a first terminal connected to the fixed level signal terminal Vf, and a second terminal connected to the signal output terminal Output. For example, the fixed level signal terminal Vf may be connected to a VGL signal in the gate driving circuit, and the first signal input terminal Input1 may be connected to a VD/S signal in the gate driving circuit.

Figure 4B:
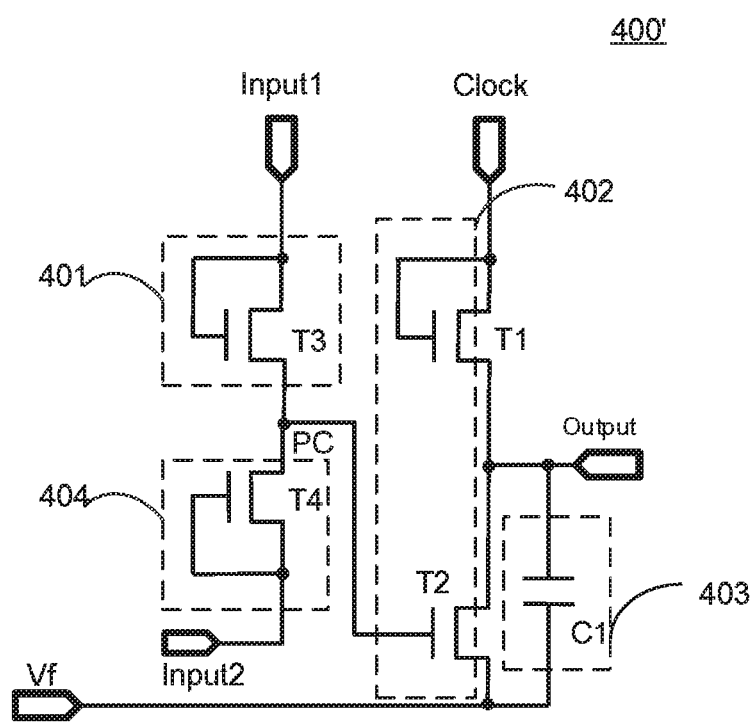

FIG. 4B illustrates a schematic circuit diagram of the scanning trigger unit in FIG. 3B. As shown in FIG. 4B, in addition to the same components as those in FIG. 4A, the scanning trigger unit 400' may further comprise a second signal input terminal Input2 and a second signal input sub-circuit 404. The second signal input sub-circuit 404 may comprise a fourth transistor T4 having a control terminal and a first terminal connected to the second signal input terminal Input2, and a second terminal connected to the control node PC. The second signal input sub-circuit 404 is configured to provide a third valid signal to the control node PC according to a signal at the second signal input terminal Input2. For example, the second signal input terminal Input2 may be connected to a VS/D signal in the gate driving circuit.

Figure 4C:
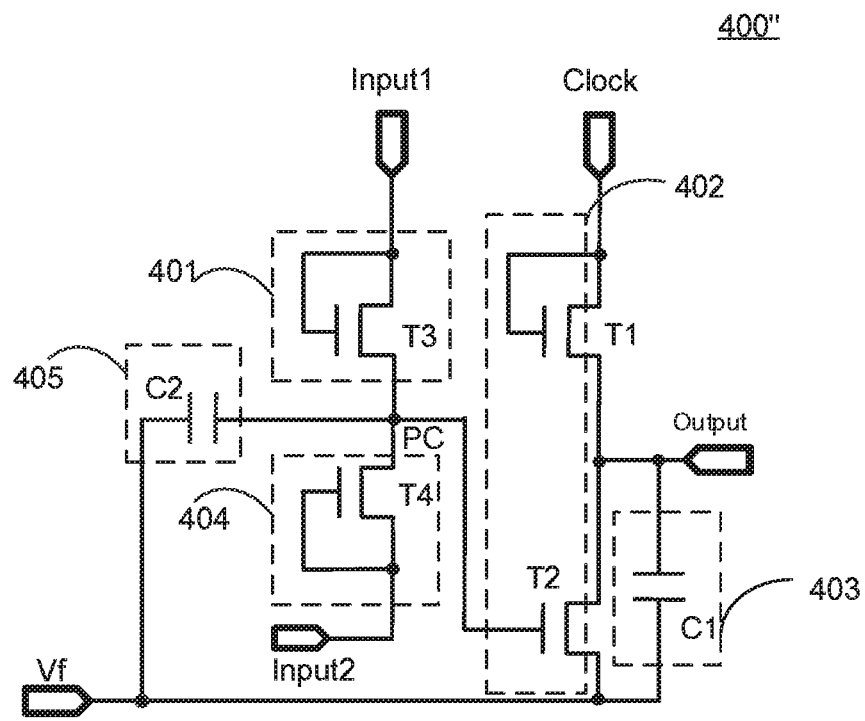

FIG. 4C illustrates a schematic circuit diagram of the scanning trigger unit in FIG. 3C. As shown in FIG. 4C, in addition to the same components as those in FIGS. 4A and 4B, the scanning trigger unit 400'' may further comprise a second holding sub-circuit 405. As shown in FIG. 4C, the second holding sub-circuit 405 is connected to the fixed level signal terminal Vf and the control node PC respectively, and is configured to hold the potential at the control node PC. For example, the second holding sub-circuit 405 may comprise a second capacitor C2 having a first terminal connected to the fixed level signal terminal Vf, and a second terminal connected to the control node PC. It can be understood by those skilled in the art that although the second capacitor C2 is not necessary, if the second capacitor C2 is provided, the potential at the control node PC can be better held.

According to the embodiments of the present disclosure, the clock signal terminal Clock in FIGS. 4A, 4B, and 4C may be connected to the CLKB signal, and the signal output terminal Output of the output sub-circuit 401 may be connected to, for example, the INPUT terminal of the first stage of SR in FIG. 2B. Thereby, an STV signal is provided to the INPUT terminal of the first stage of SR. Alternatively, the clock signal terminal Clock in FIGS. 4A, 4B, and 4C may be connected to the CLK signal, and the signal output terminal Output of the output sub-circuit 401 may be connected to, for example, the RESET terminal of the N$^{th}$ stage of SR in FIG. 2B. Thereby, a reset signal RESET is provided to the RESET terminal of the N$^{th}$ stage of SR. A ratio of a channel aspect ratio of the first transistor T1 relative to a channel aspect ratio of the second transistor T2 may be in a range from 1:6 to 1:3.

According to another aspect of the present disclosure, there is further provided a scanning trigger unit 400. As shown in FIGS. 4A and 4B, the scanning trigger unit 400 may comprise a clock signal terminal Clock, a first signal input terminal Input1, a second signal input terminal Input2, a fixed level signal terminal Vf, a signal output terminal Output, a first transistor T1, a second transistor T2, a third transistor T3, a fourth transistor T4, and a first capacitor C1. The first transistor T1 has a first terminal and a control terminal PC connected to the clock signal terminal Clock, and a second terminal connected to the signal output terminal Output. The second transistor T2 has a control terminal connected to the control node PC, a first terminal connected to the fixed level signal terminal Vf, and a second terminal connected to the signal output terminal Output. The third transistor T3 has a control terminal and a first terminal connected to the first signal input terminal Input1, and a second terminal connected to the control node PC. The fourth transistor T4 has a control terminal and a first terminal connected to the second signal input terminal Input2, and a second terminal connected to the control node PC. The first capacitor C1 has a first terminal connected to the fixed level signal terminal Vf, and a second terminal connected to the signal output terminal Output.

According to another aspect of the present disclosure, there is provided a gate driving circuit comprising at least one scanning trigger unit according to the embodiment of the present disclosure.

Figure 5A:
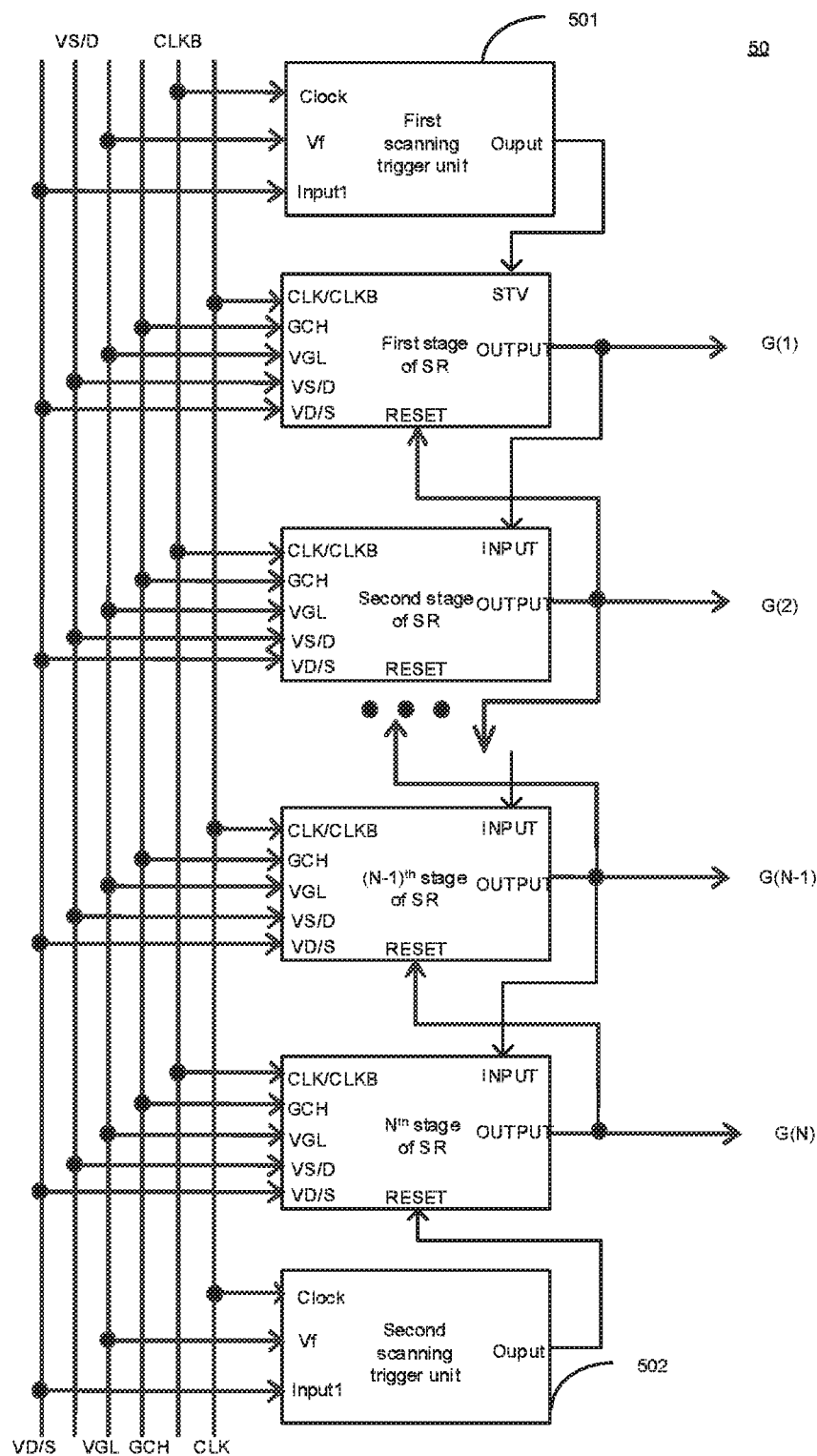
FIGS. 5A and 5B illustrate schematic diagrams of gate driving circuits according to an embodiment of the present disclosure.

FIG. 5A illustrates a schematic diagram of a gate driving circuit 50 according to an embodiment of the present disclosure. As shown in FIG. 5A, the gate driving circuit 50 according to the embodiment of the present disclosure may comprise: a first scanning trigger unit 501; N stages of shift registers having an STV signal terminal connected to a signal output terminal of the first scanning trigger unit, where N is an integer greater than or equal to 2; a first signal line VD/S connected to a first signal input terminal Input1 of the first scanning trigger unit; and a first clock signal line CLKB which may be connected to a clock signal terminal Clock of the first scanning trigger unit 501.

The gate driving circuit 50 may further comprise a second clock signal line CLK and a second scanning trigger unit 502. A clock signal on the first clock signal line CLKB is an inverted signal of a clock signal on the second clock signal line CLK, and the second scanning trigger unit 502 is the scanning trigger unit according to the embodiment of the present disclosure. A signal output terminal Output of the first scanning trigger unit 501 is connected to an input terminal INPUT of a first stage of SR. A signal output terminal Output of the second scanning trigger unit 502 is connected to an input terminal RESET of an N$^{th}$ stage of SR, and a clock signal terminal Clock of the second scanning trigger unit 502 is connected to the second clock signal line CLK. For example, the clock signal CLK and the clock signal CLKB may have a duty cycle of 50%.

It can be understood by those skilled in the art that the gate driving circuit 50 shown in FIG. 5A may be used for gate forward scanning. For ease of understanding, the term "forward scanning" herein refers to that for display of one frame of image, scanning driving signals G(1), G(2), . . . , and G(N) are sequentially generated from, for example, the first stage of SR to the N$^{th}$ stage of SR in FIG. 5A. The term "reverse scanning" refers to that for display of one frame of image, the scanning driving signals G(N), G(N−1), . . . , and G(1) are sequentially generated from, for example, the N$^{th}$ stage of SR to the first stage of SR in FIG. 5A.

Figure 5B:
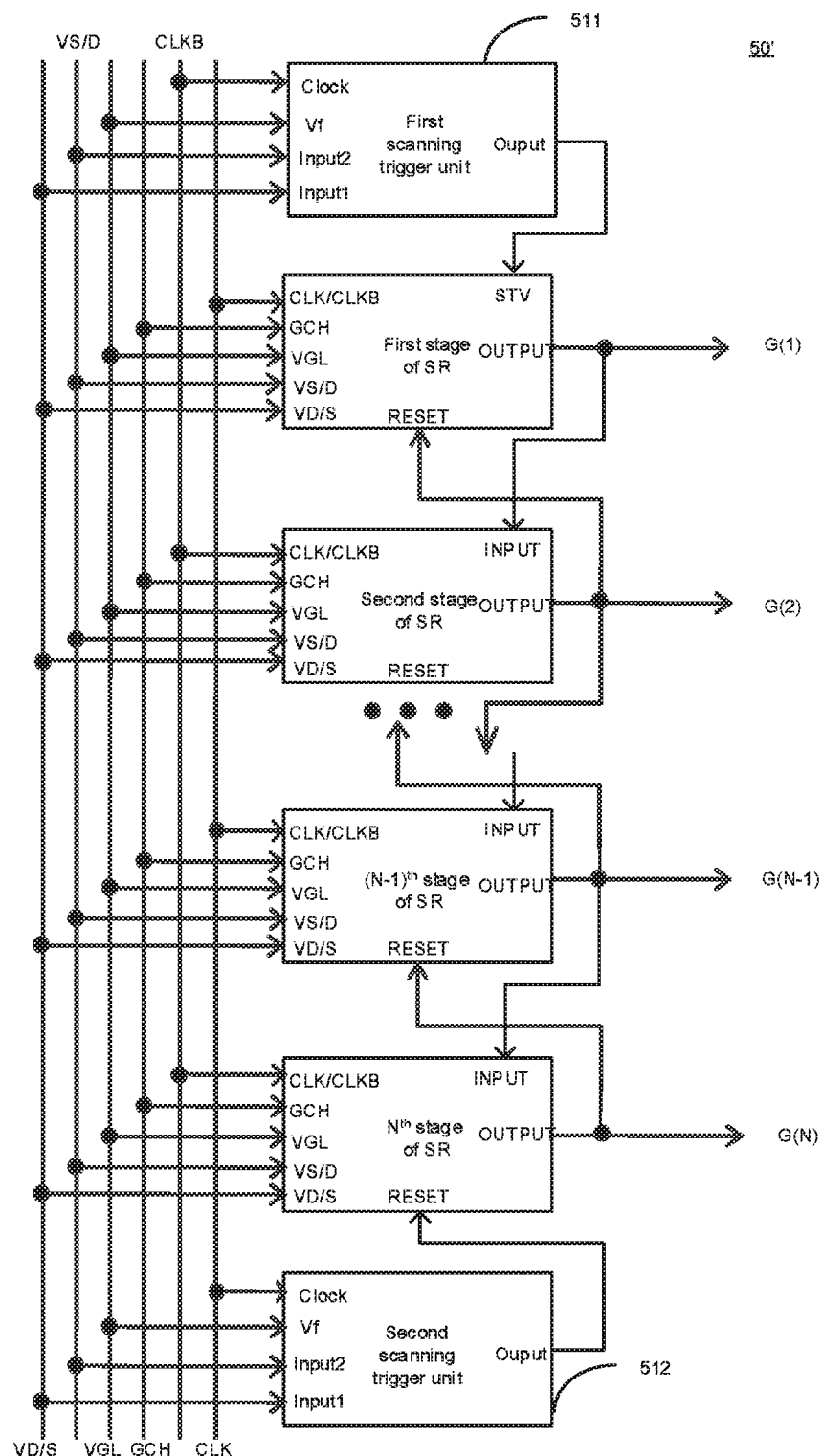

FIG. 5B illustrates a schematic diagram of a gate driving circuit 50' according to another embodiment of the present disclosure. As shown in FIG. 5B, the gate driving circuit 50' according to the embodiment of the present disclosure may comprise a first scanning trigger unit 511 which is the scanning trigger unit according to the present disclosure; a second scanning trigger unit 512, which is the scanning trigger unit according to the present disclosure; N stages of shift registers, wherein a signal output terminal of the first scanning trigger unit 511 is connected to an STV signal terminal of the N stages of shift registers, and a signal output terminal of the second scanning trigger unit 512 is connected to a reset terminal of an N$^{th}$ stage of shift register, where N is an integer greater than or equal to 2; a first signal line VD/S and a second signal line VS/D, wherein the first scanning trigger unit 511 has a first signal input terminal Input 1 connected to the first signal line VD/S, and a second signal input terminal Input 2 connected to the second signal line VS/D, and the second scanning trigger unit 512 has a first signal input terminal Input 1 connected to the first signal line VD/S, and a second signal input terminal Input 2 connected to the second signal line VS/D; and a first clock signal line CLKB and a second clock signal line CLK, wherein a clock signal on the first clock signal line CLKB is an inverted signal of a clock signal on the second clock signal line CLK, a clock signal terminal Clock of the first scanning trigger unit 511 is connected to the first clock signal line CLKB, and a clock signal terminal Clock of the second scanning trigger unit 512 is connected to the second clock signal line CLK.

It can be understood by those skilled in the art that a circuit structure and a signal connection manner of the gate driving circuit 50' shown in FIG. 5B is the same as those of the gate driving circuit 50 shown in FIG. 5A. Compared with the technical solution shown in FIG. 5A, the gate driving circuit shown in FIG. 5B may be used for realizing gate reverse scanning by only interchanging a timing of a signal on the first signal line VD/S with a timing of a clock signal on the second signal line VS/D and interchanging a timing of a signal on the first clock signal line CLKB with a timing of a clock signal on the second clock signal line CLK.

Figure 6A:
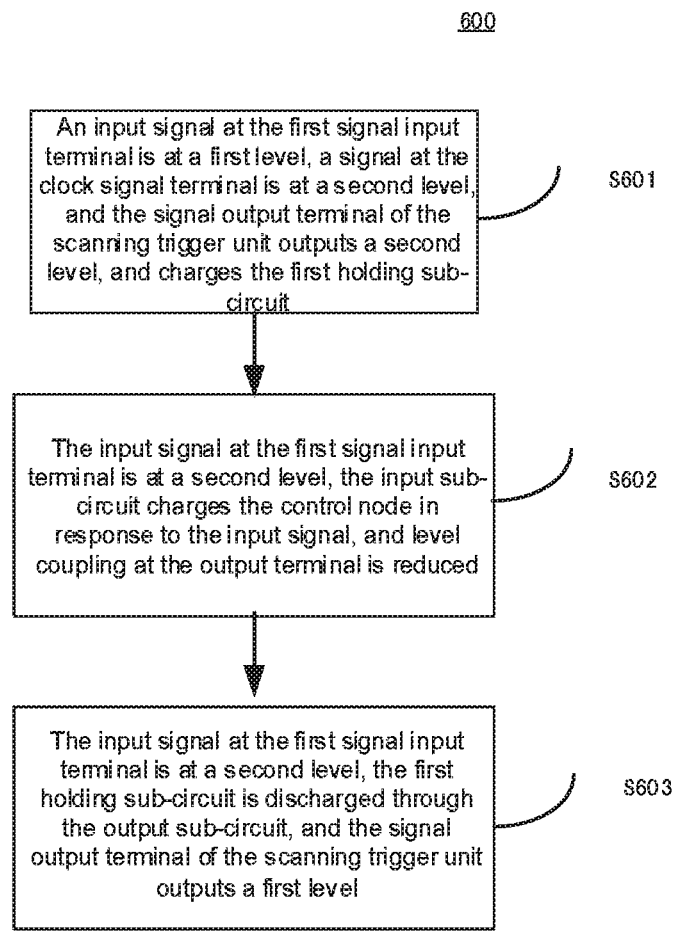
FIG. 6A illustrates a flowchart of a method for driving a scanning trigger unit according to an embodiment of the present disclosure.

The present disclosure further provides a method for driving a scanning trigger unit, which may be applied to the scanning trigger unit according to the embodiments of the present disclosure. It should be illustrated that serial numbers of various steps in the following methods are only used as a representation of the steps for convenience of description, and should not be regarded as indicating an execution order of the various steps. This method needs not to be performed exactly as shown, unless explicitly stated. FIG. 6A illustrates a flowchart of a method for driving a scanning trigger unit according to an embodiment of the present disclosure. For example, the method shown in FIG. 6A may be applied to the scanning trigger unit 400 shown in FIG. 4A and the scanning trigger unit 400' shown in FIG. 4B. As shown in FIG. 6A, the method 600 for driving a scanning trigger unit according to the embodiment of the present disclosure may comprise the following steps.

In step S601, an input signal at the first signal input terminal is at a first level, a signal at the clock signal terminal is at a second level, and the signal output terminal of the scanning trigger unit outputs a second level, and charges the first holding sub-circuit.

In step S602, the input signal at the first signal input terminal is at a second level, the input sub-circuit charges the control node in response to the input signal, and level coupling at the output terminal is reduced.

In step S603, the input signal at the first signal input terminal is at a second level, the first holding sub-circuit is discharged through the output sub-circuit, and the signal output terminal of the scanning trigger unit outputs a first level.

Figure 6B:
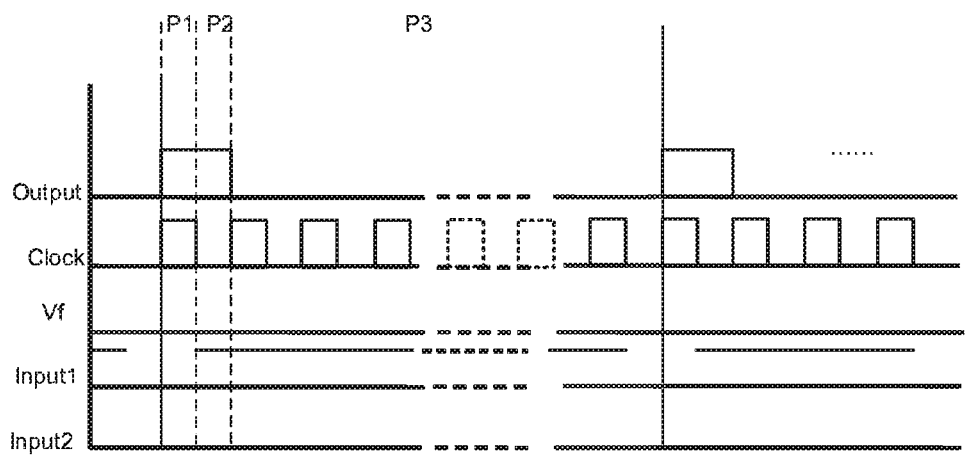
FIG. 6B illustrates a timing diagram of an operation of a scanning trigger unit according to an embodiment of the present disclosure.

FIG. 6B illustrates a timing diagram of an operation of a scanning trigger unit according to an embodiment of the present disclosure. The operation of the scanning trigger unit according to the present disclosure will be described in detail next with reference to FIGS. 4A to 4C, 6A and 6B.

As shown in FIG. 6B, in a first time period P1, an input signal at the first signal input terminal Input1 of the scanning trigger unit is at a first level (for example, a low level), a signal at the clock signal terminal Clock of the scanning trigger unit is at a second level (for example, a high level), the first transistor T1 is turned on, and the signal output terminal Output of the scanning trigger unit outputs the second level at the clock signal terminal, and charges the first capacitor C1 in the first holding sub-circuit 403.

In a second time period P2, the input signal at the first signal input terminal Input1 becomes a second level, the third transistor T3 in the first input sub-circuit 402 is turned on, and charges the control node in response to the input signal Input1, and the level coupling at the output terminal Output is reduced. However, as there are charges stored on the first capacitor C1, the output terminal Output may still be maintained at the second level although the potential thereof is slightly reduced.

In a third time period P3, the input signal at the first signal input terminal Input1 is maintained at the second level, the first holding sub-circuit 403 is discharged through the output sub-circuit 401, and the signal output terminal Output of the scanning trigger unit outputs a first level.

It can be understood by those skilled in the art that in the second time period P2 and the third time period P3, a gate driving circuit connected to the scanning trigger unit normally outputs a gate driving signal.

Figure 7A:
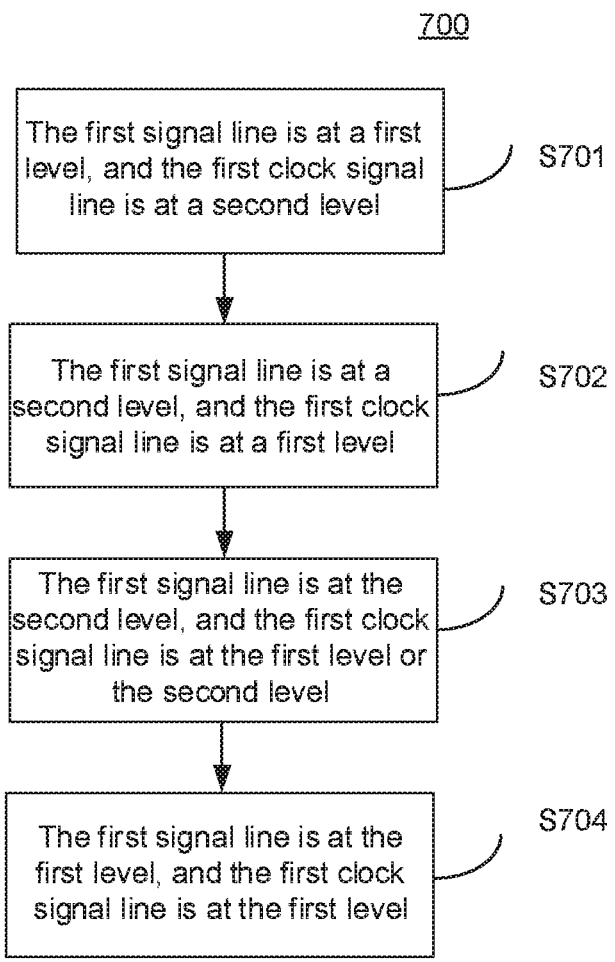
FIGS. 7A, 7B, 7C, and 7D illustrate flowcharts of methods for driving a gate driving circuit according to an embodiment of the present disclosure respectively.

According to another aspect of the present disclosure, there is provided a method for driving a gate driving circuit. FIG. 7A illustrates a flowchart of a method for driving a gate driving circuit according to an embodiment of the present disclosure. For example, the method shown in FIG. 7A may be applied to the gate driving circuit 50 shown in FIG. 5A. For example, it may be used for forward scanning driving of the gate driving circuit. As shown in FIG. 7A, the method 700 for driving a gate driving circuit according to the embodiment of the present disclosure may comprise the following steps.

In step 701 (i.e., a trigger time period), a signal on the first signal line VD/S is at a first level, a clock signal on the first clock signal line CLKB is at a second level, and the signal output terminal of the first scanning trigger unit 501 outputs a signal at a second level.

In step 702 (i.e., a holding time period), the signal on the first signal line VD/S is at a second level, the clock signal on the first clock signal line CLKB is at a first level, and the signal output terminal of the first scanning trigger unit 501 outputs a signal at the second level.

In step 703 (i.e., a driving time period), the signal on the first signal line VD/S is at the second level, the clock signal on the first clock signal line CLKB is at the first level or the second level, and the signal output terminal of the first scanning trigger unit 501 outputs a signal at a first level.

In step 704 (i.e., a resetting time period), the signal on the first signal line VD/S is at the first level, the clock signal on the first clock signal line CLKB is at the first level, and the signal output terminal of the first scanning trigger unit 501 outputs a signal at the first level.

Figure 7B:
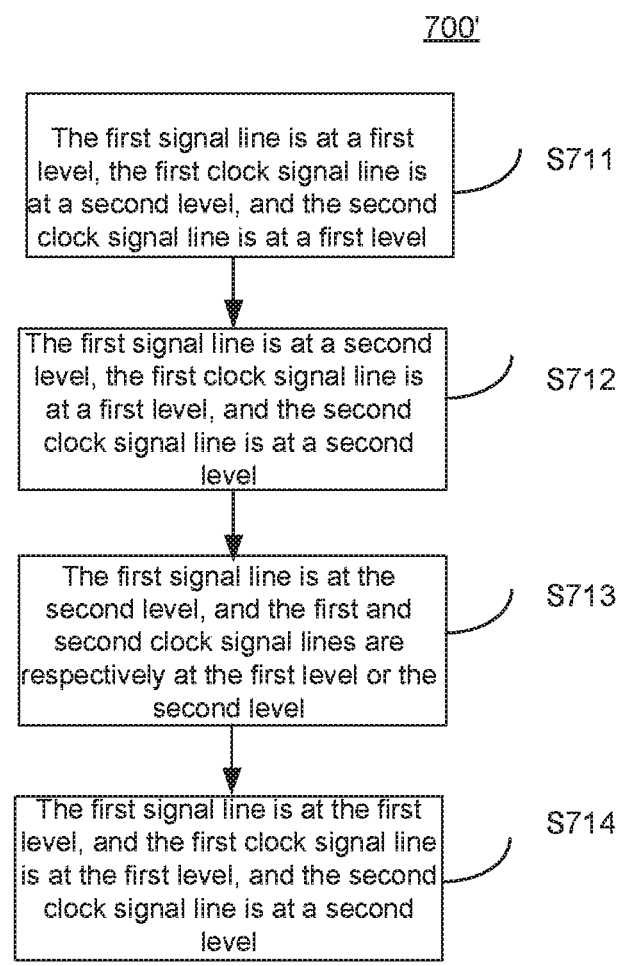

According to yet another aspect of the present disclosure, there is provided a method for driving a gate driving circuit. FIG. 7B illustrates a flowchart of a method for driving a gate driving circuit according to an embodiment of the present disclosure. For example, the method shown in FIG. 7B may be applied to the gate driving circuit 50 shown in FIG. 5A. For example, it may be used for forward scanning driving of the gate driving circuit. As shown in FIG. 7B, the method 700' for driving a gate driving circuit according to the embodiment of the present disclosure may comprise the following steps.

In step 711 (i.e., a trigger time period), a signal on the first signal line VD/S is at a first level, a clock signal on the first clock signal line CLKB is at a second level, the signal output terminal of the first scanning trigger unit 501 outputs a signal at a second level, and the signal output terminal of the second scanning trigger unit 502 outputs a signal at a second level.

In step 712 (i.e., a holding time period), the signal on the first signal line VD/S is at a second level, the clock signal on the first clock signal line CLKB is at a first level, the signal output terminal of the first scanning trigger unit 501 outputs a signal at the second level, and the signal output terminal of the second scanning trigger unit 502 outputs a signal at a first level.

In step 713 (i.e., a driving time period), the signal on the first signal line VD/S is at the second level, the clock signal on the first clock signal line CLKB is at the first level or the second level, the signal output terminal of the first scanning trigger unit 501 outputs a signal at a first level, and the signal output terminal of the second scanning trigger unit 502 outputs a signal at the first level.

In step 714 (i.e., a resetting time period), the signal on the first signal line VD/S is at the first level, the clock signal on the first clock signal line CLKB is at the first level, the signal output terminal of the first scanning trigger unit 501 outputs a signal at the first level, and the signal output terminal of the second scanning trigger unit 502 outputs a signal at the second level.

Figure 7C:
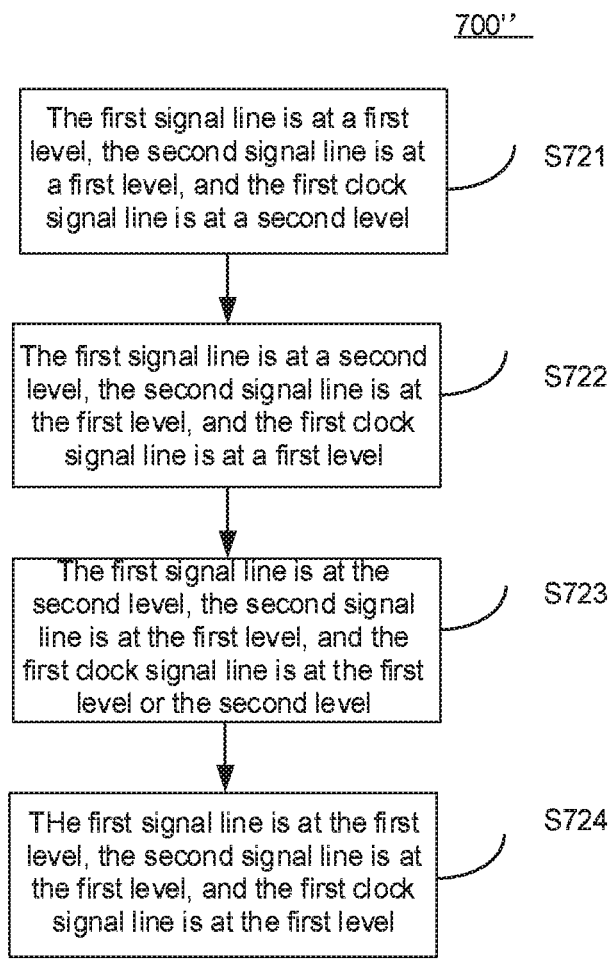

FIG. 7C illustrates a flowchart of a method for driving a gate driving circuit according to a further embodiment of the present disclosure. For example, the method shown in FIG. 7C may be applied to the gate driving circuit 50' shown in FIG. 5B. For example, it may be used for forward scanning driving of the gate driving circuit. As shown in FIG. 7C, the method 700" for driving a gate driving circuit according to the embodiment of the present disclosure may comprise the following steps.

In step S721 (i.e., a triggering time period), a signal on the first signal line VD/S is at a first level, a signal on the second signal line VS/D is at a first level, a clock signal on the first clock signal line CLKB is at a second level, the signal output terminal of the first scanning trigger unit 511 outputs a signal at a second level, and the signal output terminal of the second scanning trigger unit 512 outputs a signal at a second level.

In step S722 (i.e., a holding time period), the signal on the first signal line VD/S (with reference to the embodiment of FIG. 1, i.e., one of the first signal line or the second signal line which is connected to the input sub-circuit of the first stage of shift register) is at a second level, the signal on the second signal line VS/D is at the first level, the clock signal on the first clock signal line CLKB is at a first level, the signal output terminal of the first scanning trigger unit 511 outputs a signal at a first level, and the signal output terminal of the second scanning trigger unit 512 outputs a signal at the second level.

In step S723 (i.e., a driving time period), the signal on the first signal line VD/S is at the second level, the signal on the second signal line VS/D is at the first level, the clock signal on the first clock signal line CLKB is at the first level or the second level, the signal output terminal of the first scanning trigger unit 511 outputs a signal at the first level, and the signal output terminal of the second scanning trigger unit 512 outputs a signal at a first level.

In step S724 (i.e., a resetting time period), the signal on the first signal line VD/S is at the first level, the signal on the second signal line VS/D is at the first level, the clock signal on the first clock signal line CLKB is at the first level, the signal output terminal of the first scanning trigger unit 511 outputs a signal at the second level, and the signal output terminal of the second scanning trigger unit 512 outputs a signal at the first level.

Figure 7D:
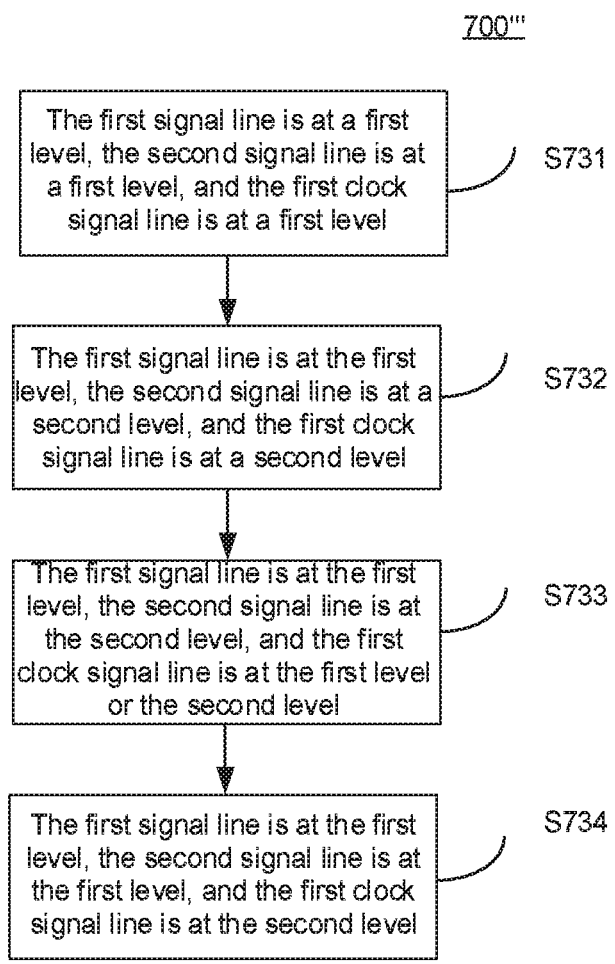

FIG. 7D illustrates a flowchart of a method for driving a gate driving circuit according to still another embodiment of the present disclosure. For example, the method shown in FIG. 7D may be applied to the gate driving circuit 50' shown in FIG. 5B. For example, it may be used for reverse scanning driving of the gate driving circuit. As shown in FIG. 7D, the method 700''' for driving a gate driving circuit according to the embodiment of the present disclosure may comprise the following steps.

In step S731 (i.e., a triggering time period), a signal on the first signal line VD/S is at a first level, a signal on the second signal line VS/D is at a first level, a clock signal on the first clock signal line CLKB is at a first level, the signal output terminal of the first scanning trigger unit 511 outputs a signal at a second level, and the signal output terminal of the second scanning trigger unit 512 outputs a signal at a second level.

In step S732 (i.e., a holding time period), the signal on the first signal line VD/S is at the first level, the signal on the second signal line VS/D (with reference to the embodiment of FIG. 1, i.e., one of the first signal line or the second signal line which is connected to the reset sub-circuit of the last stage of shift register) is at a second level, the clock signal on the first clock signal line CLKB is at a second level, the signal output terminal of the first scanning trigger unit 511 outputs a signal at a first level, and the signal output terminal of the second scanning trigger unit 512 outputs a signal at the second level.

In step S733 (i.e., a driving time period), the signal on the first signal line VD/S is at the first level, the signal on the second signal line VS/D is at the second level, the clock signal on the first clock signal line CLKB is at the first level or the second level, the signal output terminal of the first scanning trigger unit 511 outputs a signal at the first level, and the signal output terminal of the second scanning trigger unit 512 outputs a signal at a first level.

In step S734 (i.e., a resetting time period), the signal on the first signal line VD/S is at the first level, the signal on the second signal line VS/D is at the first level, the clock signal on the first clock signal line CLKB is at the second level, the signal output terminal of the first scanning trigger unit 511 outputs a signal at the second level, and the signal output terminal of the second scanning trigger unit 512 outputs a signal at the first level.

Figure 8A:
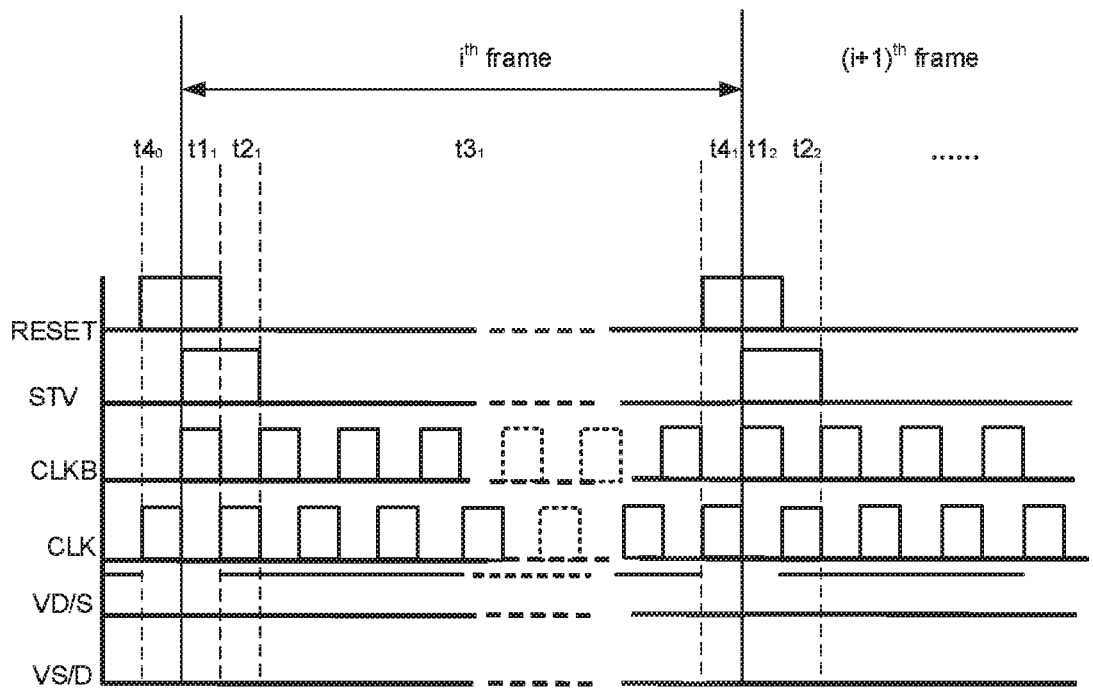
FIG. 8A illustrates a timing diagram of a driving operation of a gate driving circuit when performing forward scanning according to an embodiment of the present disclosure.

FIG. 8A illustrates a timing diagram of a driving operation of a gate driving circuit when performing forward scanning according to an embodiment of the present disclosure. Next, the operation of the gate driving circuit according to the embodiment of the present disclosure will be described in detail with reference to FIGS. 1, 4A to 4C, 5A, 6, 7A, and 8A.

As shown in FIG. 8A, for a scanning trigger unit connected to the first stage of SR, for example, the first scanning trigger unit 501 in FIG. 5A, in a first time period $t1_1$, the first signal input terminal Input1 connected to the first signal line VD/S and the second signal input terminal Input2 connected to the second signal line VS/D are both at a low level, the third transistor T3 and the fourth transistor T4 are both in a turn-off state, the control node PC is at a low potential, and the second transistor T2 is turned off. In this case, Clock connected to the first clock signal line CLKB is at a high level, the first transistor T1 is turned on, and the signal output terminal Output outputs an STV signal (a second valid signal) at a high level to the first stage of SR circuit and charges the capacitor C1. As the first signal line VD/S is at a low level in this case, the node PU is maintained at a low potential, although the transistor M1 in the first stage of SR shown in FIG. 1 is turned on. Therefore, the transistor M3 is turned off, and the OUTPUT terminal in FIG. 1 does not output a valid signal at a high level.

In a second time period $t2_1$, the second signal line VS/D is still at a low level, and the second signal input terminal Input2 is maintained at a low level. The fourth transistor T4 is in a turn-off state, the first signal line VD/S becomes a high level, the first signal input terminal Input1 becomes a high level, and the third transistor T3 is turned on to provide a first valid signal to the control node PC so that the control node PC is at the high potential, which in turns causes the second transistor T2 to be turned on. In this case, Clock is at a low level, and the first transistor T1 is turned off. As there are charges stored on the capacitor C1, the STV signal output to the first stage of SR circuit may cause the transistor M1 shown in FIG. 1, for example, to be turned on, although the level coupling at the output terminal Output is reduced. In this case, as the first signal line VD/S is at a high level, the PU point becomes a high potential, the transistor M3 is turned on, the CLK signal is at a high level, and the OUTPUT terminal outputs G[1] to start scanning of a first row of an $i^{th}$ frame of image. Then, the capacitor C1 starts to be discharged.

The capacitor C1 is configured to enable the second valid signal STV at the signal output terminal Output to be held for a predetermined time. The predetermined time is one clock cycle of the clock signal CLK/CLKB input to the clock signal terminal. For an amorphous Silicon (a-Si)-based thin film transistor, a size of the capacitor C1 may be set to 1 pF to 10 pF, and for a Low Temperature PolySilicon (LTPS)-based thin film transistor, the size of the capacitor C1 may be set to 0.1 pF to 1 pF, so that a voltage across C1 enables the signal output terminal Output to continue to output an STV signal at a high level in the second time period $t2_1$.

In a third time period $t3_1$, the second signal line VS/D is always at the low level, the fourth transistor T4 is in a turn-off state, the first signal line VD/S is maintained at a high level, and the third transistor T3 is turned on so that the control node PC is at a high potential, which in turns causes the second transistor T2 to be turned on. In the third time period $t3_1$, the clock signal on the first clock signal line CLKB alternates between a high level and a low level. The first capacitor C1 continues to be discharged. Even if the first transistor T1 is turned on when CLKB is at a high level, a ratio of a channel aspect ratio of the first transistor T1 relative to a channel aspect ratio of the second transistor T2 may be designed so that the signal output terminal Output continues to output a low level Vf (for example, VGL), thereby realizing the timing of the STV signal shown in FIG. 8A. In this case, both terminals of the first capacitor C1 are at a low level, which does not cause erroneous output. For example, the ratio of the channel aspect ratio of the first transistor T1 relative to the channel aspect ratio of the second transistor T2 may be designed to be in a range from 1:6 to 1:3.

In a fourth time period $t4_1$, the second signal line VS/D is always at the low level, the first signal line VD/S becomes a low level, the third transistor T3 and the fourth transistor T4 are both in a turn-off state, and the control node PC is at a low potential, which causes the second transistor T2 to be turned off. In this case, the clock signal CLKB on the first clock signal line is at a low level, and the signal output terminal Output still continues to output the low level Vf.

Then, the process enters a next first time period $t1_2$. It should be illustrated that the above description is made by taking an $i^{th}$ frame of image signal as an example, where i is an integer greater than or equal to 2. It can be understood by those skill in the art that a display process of the $i^{th}$ frame of image may comprise the first time period $t1_1$ to the fourth time period $t4_1$ described above. Here, the second time period $t2_1$ to the third time period $t3_1$ are normal display time periods in which the second signal line VS/D is maintained at a low level and the second signal line VD/S is maintained at a high level, as in the gate driving circuit in the related art. That is, according to the embodiment of the present disclosure, the first time period $t1_1$ is added before a normal display timing of the $i^{th}$ frame of image, and the fourth time period $t4_1$ is added after the normal display timing of the $i^{th}$ frame of image. According to the embodiment of the present disclosure, a time period having duration of one-half of a clock period is added before and after the normal display timing of one frame of image. In this time period, a voltage on the second signal line VS/D is maintained at a low level and a voltage on the first signal line VD/S becomes a low level. Thereby, the gate driving circuit according to the embodiment of the present disclosure can be driven without changing a circuit structure of the shift register as shown in FIG. 1.

Further, it can be understood by those skilled in the art that the scanning trigger unit according to the embodiment of the present disclosure performs the same operation in the time period $t4_0$ and the time period $t4_1$ shown in FIG. 8A, and performs the same operation in the time period $t1_1$ and the time period $t1_2$ shown in FIG. 8A.

Similarly, for a scanning trigger unit connected to the reset terminal of the $N^{th}$ stage of SR, for example, the second scanning trigger unit 502 in FIG. 5A, in the time period $t1_1$, the second signal line VS/D and the first signal line VD/S are both at a low level. In this case, CLK connected to the Clock terminal of the second scanning trigger unit 502 is at a low level. However, as there are charges stored on the capacitor C1, the signal output terminal Output still continues to output a high level signal to the reset terminal RESET of the $N^{th}$ stage of SR circuit. Then, the capacitor C1 starts to be discharged. For the $N^{th}$ stage of SR circuit, a high level signal at the reset terminal RESET causes the transistor M2 to be turned on, to pull down the pull-up node PU to a low potential on VS/D, thereby turning off the transistor M3 and no longer outputting the clock signal CLK. At the same time, as the PU point is pulled down, the transistor M6 is in a turn-off state, and the PD point is no longer discharged. As GCH is at a high level, the transistor M5 is turned on, to pull down the output terminal OUTPUT to VGL, thereby realizing resetting of the $N^{th}$ stage of SR circuit.

In the next time period $t2_1$, the second signal line VS/D is maintained at the low level, so that the fourth transistor T4 is in a turn-off state, the first signal line VD/S becomes a high level, and the third transistor T3 is turned on, so that the control node PC is at a high potential, which in turn causes the transistor T2 to be turned on. In this case, CLK is at a high level, and the first transistor T1 is turned on. In this case, both terminals of the capacitor C1 are at a low level, and a ratio of a channel aspect ratio of the first transistor T1 relative to a channel aspect ratio of the second transistor T2 may be designed so that the signal output terminal Output is always maintained at a low level Vf. For example, the ratio of the channel aspect ratio of the first transistor T1 relative to the channel aspect ratio of the second transistor T2 may be designed to be in a range from 1:6 to 1:3.

In the next time period t3₁, the second signal line VS/D is maintained at the low level, the fourth transistor T4 is in a turn-off state, the first signal line VD/S is maintained at the high level, and the third transistor T3 is turned on, so that the control node PC is at a high potential, which in turn causes the second transistor T2 to be turned on. In this time period, the CLK signal alternates between a high level and a low level, and the ratio of the channel aspect ratio of the first transistor T1 relative to the channel aspect ratio of the second transistor T2 may be designed, so that the signal output terminal Output is always maintained at a low level Vf, thereby realizing the timing of the RESET signal shown in FIG. 8A. For example, the ratio of the channel aspect ratio of the first transistor T1 relative to the channel aspect ratio of the second transistor T2 may be designed to be in a range from 1:6 to 1:3.

In the time period t4₁, the second signal line VS/D is at the low level, the first signal line VD/S becomes the low level, the third transistor T3 and the fourth transistor T4 are both in a turn-off state, the control node PC is at a low level, and the second transistor T2 is turned off. In this case, CLK is at a high level, and the first transistor T1 is turned on, so that the signal output terminal Output outputs a RESET signal at a high level to the reset terminal RESET of the $N^{th}$ stage of SR circuit, and charges the first capacitor C1 at the same time. For the $N^{th}$ stage of SR circuit shown in FIG. 1, for example, the clock signal CLKB connected to the $N^{th}$ stage of SR circuit is at a low level in this case, and therefore the OUTPUT terminal of FIG. 1 does not output a high level signal.

Figure 8B:
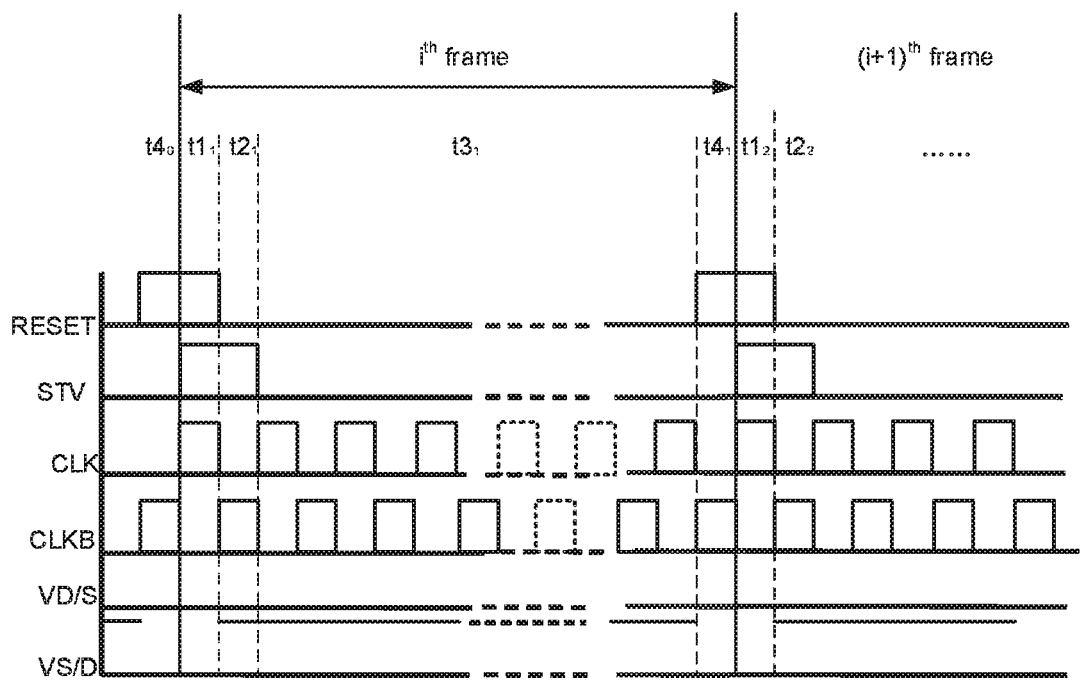
FIG. 8B illustrates a timing diagram of a driving operation of a gate driving circuit when performing reverse scanning according to an embodiment of the present disclosure.

FIG. 8B illustrates a timing diagram of a driving operation of a gate driving circuit when performing reverse scanning according to an embodiment of the present disclosure. The operation timing diagram shown in FIG. 8B may be applied to the gate driving circuit shown in FIG. 5B. It can be understood by those skilled in the art that the same description as those in the embodiments shown in FIGS. 5A and 8A are omitted below for the sake of brevity.

As shown in FIG. 8B, when reverse scanning is performed, in a first time period t1₁, a signal on the first signal line VD/S is at a first level (for example, a low level), a signal on the second signal line VS/D is at a first level, a clock signal on the second clock signal line CLK is at a second level, a clock signal on the first clock signal line CLKB is at a first level, and the signal output terminal Output of the first scanning trigger unit 511 outputs a signal at a second level (for example, a high level) to the reset terminal of the first stage of SR. The signal output terminal of the second scanning trigger unit 512 outputs a signal at a second level to the STV terminal of the $N^{th}$ stage of SR.

In a second time period t2₁, the signal on the first signal line VD/S is maintained at the first level, the signal on the second signal line VS/D becomes a second level, the clock signal on the first clock signal line CLKB is at a second level, the clock signal on the second clock signal line CLK is at a first level, the signal output terminal Output of the second scanning trigger unit 512 outputs a signal at the second level to the STV terminal, and the signal output terminal of the first scanning trigger unit 511 outputs a signal at a first level.

In a third time period t3₁, the signal on the first signal line VD/S is maintained at the first level, the signal on the second signal line VS/D is at the second level, the clock signal on the first clock signal line CLKB is at the first level or the second level, and both the signal output terminal of the first scanning trigger unit 511 and the signal output terminal of the second scanning trigger unit 512 output a signal at the first level.

In a fourth time period t4₁, the signal on the first signal line VD/S is maintained at the first level, the signal on the second signal line VS/D is at the first level, the clock signal on the first clock signal line CLKB is at the second level, the clock signal on the second clock signal line CLK is at the first level, the signal output terminal Output of the first scanning trigger unit 511 outputs a signal at the second level, and the signal output terminal Output of the second scanning trigger unit 512 outputs a signal at the first level.

Figure 9:
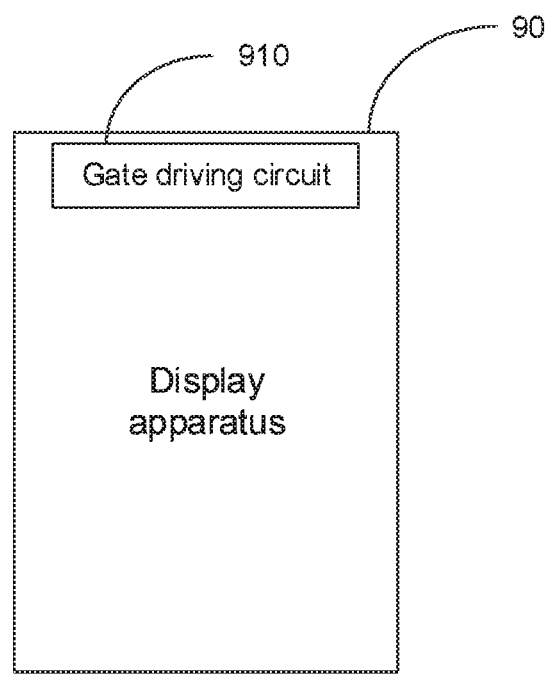
FIG. 9 illustrates a schematic block diagram of a display apparatus according to an embodiment of the present disclosure.

FIG. 9 illustrates a schematic block diagram of a display apparatus according to an embodiment of the present disclosure. As shown in FIG. 9, the display apparatus 90 may comprise a gate driving circuit 910 according to an embodiment of the present disclosure. The display apparatus 90 according to the embodiment of the present disclosure may be any product or component having a display function such as an electronic paper, a mobile phone, a tablet computer, a television, a display, a notebook computer, a digital photo frame, a navigator, etc.

The purposes, technical solutions and beneficial effects of the embodiments of the present disclosure have been described in further detail in the above specific embodiments. It should be understood that the above description is merely specific embodiments of the present disclosure and is not intended to limit the present disclosure. Any modifications, equivalent substitutions, improvements, etc., made within the spirit and scope of the present disclosure are intended to be included within the protection scope of the present disclosure.

We claim:

1. A gate driving circuit, comprising:
   a first scanning trigger unit comprising a clock signal terminal, a first signal input terminal, a fixed level signal terminal, a first input sub-circuit, an output sub-circuit, a first holding sub-circuit, and a signal output terminal;
   N stages of shift registers having an STV signal terminal connected to the signal output terminal of the first scanning trigger unit, where N is an integer greater than or equal to 2;
   a first signal line connected to the first signal input terminal of the first scanning trigger unit; and
   a first clock signal line connected to the clock signal terminal of the first scanning trigger unit,
   wherein the first input sub-circuit is connected to the first signal input terminal and a control node respectively, and is configured to provide a first valid signal to the control node according to a signal at the first signal input terminal,
   the output sub-circuit is connected to the fixed level signal terminal, the clock signal terminal, and the control node, and is configured to provide a second valid signal to the signal output terminal according to a signal at the control node and a signal at the clock signal terminal, and
   the first holding sub-circuit is connected to the fixed level signal terminal and the signal output terminal, and is configured to hold the second valid signal at the signal output terminal for a predetermined time.

2. The gate driving circuit according to claim 1, further comprising: a second clock signal line; and
   a second scanning trigger unit comprising a clock signal terminal, a second signal input terminal, a fixed level signal terminal, a second input sub-circuit, an output sub-circuit, a second holding sub-circuit, and a signal output terminal, wherein the second input sub-circuit of the second scanning trigger unit is connected to the second signal input terminal and a control node of the second scanning trigger unit respectively, and is configured to provide a second valid signal to the control node of the second scanning trigger unit according to a signal at the second signal input terminal of the second scanning trigger unit;

the output sub-circuit of the second scanning trigger unit is connected to the fixed level signal terminal, the clock signal terminal, and the control node of the second scanning trigger unit, and is configured to provide a third valid signal to the signal output terminal of the second scanning trigger unit according to a signal at the control node of the second scanning trigger unit and a signal at the clock signal terminal of the second scanning trigger unit; and the second holding sub-circuit of the second scanning trigger unit is connected to the fixed level signal terminal and the signal output terminal of the second scanning trigger unit, and is configured to hold the third valid signal at the signal output terminal of the second scanning trigger unit for a predetermined time, having the signal output terminal of the second scanning trigger unit connected to a reset terminal of an $N^{th}$ stage of shift register, and the clock signal terminal of the second scanning trigger unit connected to the second clock signal line, wherein a clock signal on the first clock signal line is an inverted signal of a clock signal on the second clock signal line.

3. A display apparatus, comprising the gate driving circuit according to claim 1.

4. A display apparatus, comprising the gate driving circuit according to claim 2.

5. The gate driving circuit according to claim 1, wherein the output sub-circuit comprises a first transistor and a second transistor, wherein the first transistor has a first terminal and a control terminal connected to the clock signal terminal, and a second terminal connected to the signal output terminal, and the second transistor has a control terminal connected to the control node, a first terminal connected to the fixed level signal terminal, and a second terminal connected to the signal output terminal.

6. The gate driving circuit according to claim 1, wherein the first holding sub-circuit comprises a first capacitor having a first terminal connected to the fixed level signal terminal, and a second terminal connected to the signal output terminal.

7. The gate driving circuit according to claim 6, wherein the first capacitor is configured so that the predetermined time is one clock cycle of a clock signal input to the clock signal terminal.

8. The gate driving circuit according to claim 1, wherein the first input sub-circuit comprises:
a third transistor having a control terminal and a first terminal connected to the first signal input terminal, and a second terminal connected to the control node.

9. The gate driving circuit according to claim 1, further comprising a second holding sub-circuit, wherein the second holding sub-circuit is connected to the fixed level signal terminal and the control node respectively, and is configured to hold a potential at the control node.

10. The gate driving circuit according to claim 9, wherein the second holding sub-circuit comprises a second capacitor having a first terminal connected to the fixed level signal terminal, and a second terminal connected to the control node.

11. A gate driving circuit, comprising:
a first scanning trigger unit and a second scanning trigger unit, N stages of shift registers, wherein a signal output terminal of the first scanning trigger unit is connected to an STV signal terminal of the N stages of shift registers, and a signal output terminal of the second scanning trigger unit is connected to a reset terminal of an $N^{th}$ stage of shift register, where N is an integer greater than or equal to 2;

a first signal line and a second signal line, wherein the first scanning trigger unit has a first signal input terminal connected to the first signal line, and a second signal input terminal connected to the second signal line, and the second scanning trigger unit has a first signal input terminal connected to the first signal line, and a second signal input terminal connected to the second signal line; and a first clock signal line and a second clock signal line, wherein a clock signal on the first clock signal line is an inverted signal of a clock signal on the second clock signal line, a clock signal terminal of the first scanning trigger unit is connected to the first clock signal line, and a clock signal terminal of the second scanning trigger unit is connected to the second clock signal line, wherein each of the first scanning trigger unit and the second scanning trigger unit comprises the clock signal terminal, the first signal input terminal, the second signal input terminal, a fixed level signal terminal, a first input sub-circuit, a second input sub-circuit, an output sub-circuit, a first holding sub-circuit, and the signal output terminal, the first input sub-circuit is connected to the first signal input terminal and a control node respectively, and is configured to provide a first valid signal to the control node according to a signal at the first signal input terminal, the output sub-circuit is connected to the fixed level signal terminal, the clock signal terminal, and the control node, and is configured to provide a second valid signal to the signal output terminal according to a signal at the control node and a signal at the clock signal terminal, the first holding sub-circuit is connected to the fixed level signal terminal and the signal output terminal, and is configured to hold the second valid signal at the signal output terminal for a predetermined time, and the second input sub-circuit is connected to the second signal input terminal and the control node respectively, and is configured to provide a third valid signal to the control node according to a signal at the second signal input terminal.

12. A display apparatus, comprising the gate driving circuit according to claim 11.

13. The gate driving circuit according to claim 11, wherein the second input sub-circuit comprises:
a fourth transistor having a control terminal and a first terminal connected to the second signal input terminal, and a second terminal connected to the control node.

14. A method for driving a gate driving circuit, wherein the gate driving circuit comprises a first scanning trigger unit, N stages of shift registers having an STV signal terminal connected to a signal output terminal of the first scanning trigger unit, where N is an integer greater than or equal to 2, a first signal line connected to a first signal input terminal of the first scanning trigger unit, and a first clock signal line connected to a clock signal terminal of the first scanning trigger unit, wherein the first scanning trigger unit comprises the clock signal terminal, the first signal input terminal, a fixed level signal terminal, a first input sub-circuit, an output sub-circuit, a first holding sub-circuit, and the signal output terminal, wherein the first input sub-circuit is connected to the first signal input terminal and a control node respectively, and is configured to provide a first valid signal to the control node according to a signal at the first signal input terminal, the output sub-circuit is connected to the fixed level signal terminal, the clock signal terminal, and the control node, and is configured to provide a second valid signal to the signal output terminal according to a signal at the control node and a signal at the clock signal terminal, and the first holding sub-circuit is connected to the fixed level signal terminal and the signal output terminal, and is configured to hold the second valid signal at the signal output terminal for a predetermined time, wherein the method comprises:

in a triggering time period, providing a signal having a first level through the first signal line, and providing a clock signal having a second level through the first clock signal line;

in a holding time period, providing a signal having a second level through the first signal line, and providing a clock signal having a first level through the first clock signal line;

in a driving time period, providing a signal having the second level through the first signal line, and providing a signal having the first level and a signal having the second level periodically through the first clock signal line; and in a resetting time period, providing a signal having the first level through the first signal line, and providing a clock signal having the first level through the first clock signal line.

15. The method according to claim 14, wherein the gate driving circuit further comprises a second clock signal line and a second scanning trigger unit, the second scanning trigger unit having a signal output terminal connected to a reset terminal of an $N^{th}$ stage of shift register, a first signal input terminal connected to the first signal line, and a clock signal terminal connected to the second clock signal line, wherein a clock signal on the first clock signal line is an inverted signal of a clock signal on the second clock signal line, wherein the second scanning trigger unit has a same structure as the first scanning trigger unit, wherein the method further comprises:

in a triggering time period, providing a clock signal having a first level through the second clock signal line;

in a holding time period, providing a clock signal having a second level through the second clock signal line;

in a driving time period, providing a signal having the first level and a signal having the second level periodically through the second clock signal line; and in a resetting time period, providing a clock signal having the second level through the second clock signal line.

16. The method according to claim 15, wherein the gate driving circuit further comprises a second signal line, wherein the first scanning trigger unit has a second signal input terminal connected to the second signal line, and the second scanning trigger unit has a second signal input terminal connected to the second signal line, each of the first and second scanning trigger units further comprises a second input sub-circuit, wherein the second input sub-circuit is connected to the second signal input terminal and the control node respectively, and is configured to provide a third valid signal to the control node according to a signal at the second signal input terminal, wherein the method comprises, in all periods, providing a signal having a first level through the second signal line.

* * * * *